United States Patent [19]

Takahashi

[11] Patent Number: 5,864,159
[45] Date of Patent: Jan. 26, 1999

[54] INSULATED GATE SEMICONDUCTOR DEVICE STRUCTURE TO PREVENT A REDUCTION IN BREAKDOWN VOLTAGE

[75] Inventor: Hideki Takahashi, Tokyo, Japan

[73] Assignee: Mitsubishi Denki Kabushiki Kaisha, Tokyo, Japan

[21] Appl. No.: 900,825

[22] Filed: Jul. 25, 1997

Related U.S. Application Data

[63] Continuation of Ser. No. 561,583, Nov. 21, 1995, abandoned.

[30] Foreign Application Priority Data

Dec. 13, 1994 [JP] Japan .................................... 6-309106

[51] Int. Cl.$^6$ .............................. H01L 29/76; H01L 29/94
[52] U.S. Cl. ......................... 257/330; 257/267; 257/328; 257/329; 257/331; 257/334; 257/339; 438/267; 438/270
[58] Field of Search ..................................... 257/327, 329, 257/330, 331, 333, 334, 267, 328, 339; 438/267, 270

[56] References Cited

U.S. PATENT DOCUMENTS

| | | | |
|---|---|---|---|
| 5,001,526 | 3/1991 | Gotou ....................................... | 257/330 |
| 5,082,795 | 1/1992 | Temple ...................................... | 437/41 |
| 5,378,911 | 1/1995 | Murakami ................................ | 257/334 |
| 5,385,853 | 1/1995 | Mohammad ............................ | 437/270 |

FOREIGN PATENT DOCUMENTS

| | | |
|---|---|---|
| 0 345 380 | 12/1989 | European Pat. Off. . |
| 0564094 | 10/1993 | European Pat. Off. ............... 257/330 |
| 0 583 022 | 2/1994 | European Pat. Off. . |
| 59 8374 | 1/1984 | Japan . |
| 0368173 | 3/1991 | Japan ..................................... 257/330 |
| 4 162572 | 6/1992 | Japan . |
| 4162573 | 6/1992 | Japan ..................................... 257/330 |
| 0582792 | 4/1993 | Japan ..................................... 257/330 |
| WO 92/14269 | 8/1992 | WIPO . |

OTHER PUBLICATIONS

Yilmaz, "Power Metal–Oxide–Semiconductor Field Effect Transistor", World Intellectual Property Organization, PCT, WO 92/14269, Aug. 20, 1992.
IEEE Transactions of Electron Devices, vol. ED–34, No. 11, pp. 2329–2334, Nov. 1987, H.R. Chang, et al., "Self–Aligned UMOSFET's With a Specific On–Resistance of 1 M Omega *CM/SUP 2/".

*Primary Examiner*—Valencia Martin Wallace
*Attorney, Agent, or Firm*—Oblon, Spivak, McClelland, Maier & Neustadt, P.C.

[57] ABSTRACT

A P$^-$ layer (51) is formed between a P base layer (43) and an N$^-$ layer (42) so as to be in contact with the P base layer (43), facing an insulating film (46) of a trench (45) with the N$^-$ layer (42) between. In the configuration, a depletion layer extends to the P$^-$ layer (51) to relieve an electric field at a tip end portion of the trench (45) and a channel length can be lessened. Therefore, it is possible to provide an insulated gate semiconductor device of high breakdown voltage and low On-resistance.

16 Claims, 27 Drawing Sheets

F I G. 40
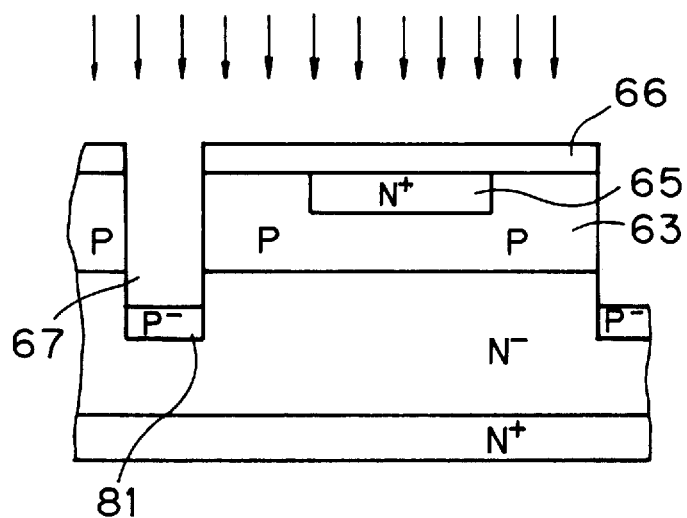
F I G. 41
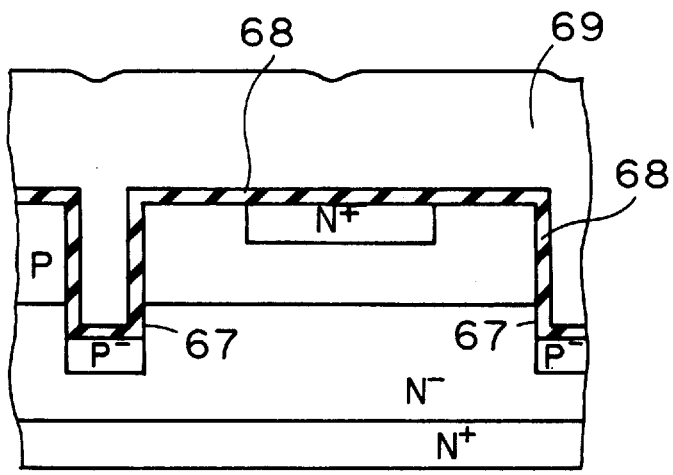

5,864,159

1

INSULATED GATE SEMICONDUCTOR DEVICE STRUCTURE TO PREVENT A REDUCTION IN BREAKDOWN VOLTAGE

This application is a Continuation of application Ser. No. 08/561,583, filed on Nov. 21, 1995, now abandoned.

BACKGROUND OF THE INVENTION

1. Field of the Invention

The present invention relates to an insulated gate semiconductor device and a method of manufacturing the same, and more particularly to a device structure to prevent a reduction in breakdown voltage of a power semiconductor device which has a trench MOS gate where a channel is formed in a surface of a trench buried in a semiconductor substrate, and to a method of manufacturing the device.

2. Description of the Background Art

FIG. 50 is a cross-sectional view of an insulated gate semiconductor device in a background art. Referring to this figure, now a vertical MOS (metal oxide semiconductor) transistor (hereinafter referred to as "UMOS") of a trench-gate structure will be discussed as an example. This UMOS is used for low breakdown voltage of 200 V or below, for example, used for an electrical equipment system of an automobile.

FIG. 50 shows an $N^+$ substrate 1, an $N^-$ layer 2, a P base layer 3, an $N^+$ source region 4, a trench 5, a gate insulating film 6, a gate 7, an interlayer insulating film 8, a source electrode 9, a drain electrode 10 and a channel region 11. Reference character L represents a spacing between the adjacent trenches.

Next, an operation of the UMOS will be discussed. When a prescribed drain voltage $V_{DS}$ is applied across the source electrode 9 and the drain electrode 10 and a prescribed gate voltage $V_{GS}$ is applied across the source electrode 9 and the gate 7, the channel region 11 of the P base layer 3 in the vicinity of the gate insulating film 6 is inverted to N type, thus forming a path for electric charges, i.e., a channel. The channel produces continuity between the source and drain, and the resistance of the UMOS produced at this time is called an ON-resistance.

In an On state, that is, a state where there is continuity between the source and drain, if the gate voltage $V_{GS}$ applied across the source electrode 9 and the gate 7 is changed to 0 V or a negative voltage, i.e., reverse bias, the gate is turned off and the channel region 11 of N type is inverted again to P type, entering an OFF state where there is no continuity between the source and drain. Thus, the control over the gate voltage $V_{GS}$ makes it possible to control a current flow between the source and drain, and therefore the UMOS can be used as a power switching device.

The drain voltage $V_{DS}$ applied to the UMOS when the gate is in the OFF state is referred to as a breakdown voltage of a device. The breakdown voltage of a device is generally determined by an impurity concentration and thickness of the $N^-$ layer 2 and in the case of the UMOS, further depends on a structure of a surface region of the device. Especially in the UMOS of trench structure, since the trench 5 protrudes into the $N^-$ layer 2 through the P base layer 3, the breakdown voltage of the device is dependent on the condition of a tip portion of the trench 5 protruding into the $N^-$ layer 2.

FIG. 51 is a simulation graph showing an electric field of the UMOS of trench structure. In the simulation, it is assumed that the impurity concentration of the $N^-$ layer 2 is

2

1 Ωcm and the thickness from a surface of the P base layer 3 to a bottom surface of the $N^-$ layer 2 is 8.5 μm. The upper-left rectangular portion of FIG. 51 represents a portion of trench structure.

As can be seen form FIG. 51, when the drain voltage $V_{DS}$ is applied to the UMOS, a depletion region extends from the P base layer 3 to the $N^-$ layer 2, but the equipotential lines form loops to be discontinuous at the portion where the trench 5 protrudes into the $N^-$ layer 2, indicating that the electric field becomes stronger at the tip end portion of the trench 5. The breakdown voltage of the device depends on the electric field strength at the tip end portion.

The breakdown voltage of the device, which is dependent on a condition of the tip end portion of the trench 5, undergoes a more strict situation when the gate voltage $V_{GS}$ is changed into the reverse bias.

Specifically, the sum of the drain voltage $V_{DS}$ applied to the UMOS and the reverse-biased gate voltage $V_{GS}$ is applied to the tip portion of the trench 5 protruding into the $N^-$ layer 2. Accordingly, the breakdown voltage of the device when the gate voltage $V_{GS}$ is reversely biased is lower by a reverse-bias of the gate voltage $V_{GS}$ as compared with the case where the gate voltage $V_{GS}$ is 0 V.

As a countermeasure for reduction in breakdown voltage of the UMOS having trench structure, for example, a proposed device structure is disclosed in U.S. Pat. No. 5,072,266.

FIG. 52 is a cross-sectional perspective view of the device disclosed in U.S. Pat. No. 5,072,266. The device has a structure in which a central portion of the P base layer 3 extends deeper than the trench 5 does as shown in FIG. 52. Other structures of the device are the same as that of the background-art UMOS of FIG. 50.

When the drain voltage $V_{DS}$ is applied to the UMOS of FIG. 52, the depletion region extends from the P base layer 3 to the $N^-$ layer 2 in the same manner as the UMOS of FIG. 50. In the UMOS of FIG. 52, however, since the central portion of the P base layer 3 extends deeper than the trench 5, the equipotential lines form fewer loops at the tip end portion of the trench 5 and a gradual change of the equipotential lines can be found, from those which extend to an adjacent trench to those which enclose the trench 5. Accordingly, the discontinuity of the depletion region at the tip end portion of the trench 5 is relieved and the reduction in breakdown voltage of the device at the tip end portion of the trench 5 can be suppressed.

Furthermore, since the distance from the central portion of the P base layer 3 to the $N^+$ substrate 1 is shorter than that from the tip end portion of the trench 5 to the $N^+$ substrate 1, a breakdown occurs at the central portion of the P base layer 3 and the breakdown voltage is dependent on the central portion of the P base layer 3. Accordingly, even if the gate voltage $V_{GS}$ is reversely biased, it is possible to keep the breakdown voltage of the device from becoming lower by the reverse bias of the gate voltage $V_{GS}$.

To ensure the required breakdown voltage of the device, however, in the device structure of the UMOS as shown in FIG. 52, the distance from the central portion of the P base layer 3 to the $N^+$ substrate 1 should be long, that is, the $N^-$ layer 2 should be thick, since the central portion of the P base layer 3 extends deeper than the trench 5. In the case of the UMOS having a trench structure, a current path is found from the tip end portion of the trench 5 through the channel region 11 to the drain electrode in the ON state, and therefore the $N^+$ layer 2 of greater thickness causes a higher On-resistance.

In the device structure of the UMOS as shown in FIG. 52, the trench 5 extends deeper than the P base layer 3 at a portion where the trench 5 and the P base layer 3 come into contact although the central portion of the P base layer 3 extends deeper than the trench 5. In order to form the P base layer 3, which is generally obtained by diffusion, the distance between the adjacent trenches 5 requires, at least, the sum of the length of an opening from which the impurity is implanted and twice the depth of the central portion of the P base layer 3, because the impurity is diffused over the same range in vertical and horizontal directions.

An evaluation of the spacing between the adjacent trenches on the basis of a commonly-used device size, assuming that the length of the opening at the central portion of the P base layer 3 is 2 $\mu$m, the depth of the trench is 2 $\mu$m and the depth of the central portion of the P base layer 3 is 3 $\mu$m, determines the spacing L between the trenches to be about 8 $\mu$m. As the spacing L between the trenches becomes larger than 8 $\mu$m, the ON-resistance of the UMOS becomes higher. A test reveals that the ON-resistance becomes higher by about 0.18 $\Omega$cm$^2$ as a cell pitch (the spacing between the central portions of the adjacent trenches) becomes wider by 1 $\mu$m.

SUMMARY OF THE INVENTION

The present invention is directed to an insulated gate semiconductor device. According to the first aspect of the present invention, the insulated gate semiconductor device comprises: a semiconductor substrate of a first conductivity type, having a first major surface and a second major surface; a first semiconductor layer of a second conductivity type disposed on the first major surface of the semiconductor substrate, having a surface and at least one trench with an opening at the surface reaching the first major surface of the semiconductor substrate in a direction vertical to the surface of the first semiconductor layer; an insulating film formed over an inside wall of the at least one trench; a conductor disposed inside the at least one trench, being opposed to the first semiconductor layer with the insulating film therebetween, and electrically connected to a control electrode; a second semiconductor layer of the first conductivity type disposed in a portion of the surface of the first semiconductor layer, being opposed to the conductor with the insulating film therebetween; an insulating layer so disposed as to cover a portion of a surface of the second semiconductor layer and a surface of the conductor; a third semiconductor layer of the second conductivity type disposed between the first major surface of the semiconductor substrate and the first semiconductor layer, the impurity concentration of which is lower than that of the first semiconductor layer; a first main electrode disposed on the surfaces of the first and second semiconductor layers; and a second main electrode disposed on the second major surface of the semiconductor substrate.

According to the second aspect of the present invention, in the insulated gate semiconductor device of the first aspect, the third semiconductor layer is opposed to the at least one trench with a portion of the semiconductor substrate therebetween.

According to the third aspect of the present invention, in the insulated gate semiconductor device of the first or second aspect, the at least one trench includes a plurality of trenches, the second semiconductor layer includes a plurality of fourth semiconductor layers adjoining the plurality of trenches along both the sides of the openings, and two of the fourth semiconductor layers existing between adjacent ones of the plurality of trenches are arranged so that the first semiconductor layer may be laid between two fourth semiconductor layers.

According to the fourth aspect of the present invention, in the insulated gate semiconductor device of the first or second aspect, the at least one trench includes a plurality of trenches, and the second semiconductor layers include a plurality of fourth semiconductor layers which extend in parallel with each other, intersecting openings of the plurality of trenches.

According to the fifth aspect of the present invention, an insulated gate semiconductor device comprises: a semiconductor substrate of a first conductivity type, having a first major surface and a second major surface; a first semiconductor layer of a second conductivity type disposed on the first major surface of the semiconductor substrate, having a surface, at least one first trench and at least one second trench, the at least one first trench and the at least one second trench each having an opening at the surface, being parallel and reaching the first major surface of the semiconductor substrate; a first insulating film formed over an inside wall of the at least one first trench; a second insulating film formed over an inside wall of the at least one second trench; a first conductor disposed inside the at least one first trench, being opposed to the first semiconductor layer with the first insulating film therebetween; a second conductor disposed inside the at least one second trench, being opposed to the first semiconductor layer with the second insulating film therebetween; a second semiconductor layer of the first conductivity type disposed in a portion of the surface of the first semiconductor layer, being opposed to the first conductor with the first insulating film therebetween; an insulating layer so disposed as to cover a surface of the first conductor and a portion of a surface of the second semiconductor layer; a first main electrode short circuited to the second conductor and disposed on the surfaces of the first and second semiconductor layers; a second main electrode disposed on the second major surface of the semiconductor substrate; and a control electrode connected to the first conductor.

According to the sixth aspect of the present invention, in the insulated gate semiconductor device of the fifth aspect, a plurality of third semiconductor layers of the second conductivity type, the impurity concentration of which is lower than that of the first semiconductor layer, are disposed in portions of the semiconductor substrate which are opposed to the first conductor at a bottom portion of the at least one first trench with the first insulating film therebetween and/or the second conductor at a bottom portion of the at least one second trench with the second insulating film therebetween.

According to the seventh aspect of the present invention, in the insulated gate semiconductor device of the fifth or sixth aspect, the third semiconductor layers are disposed, being opposed only to the second conductor in the second trench with the second insulating film therebetween.

According to the eighth aspect of the present invention, in the insulated gate semiconductor device of the fifth, sixth or seventh aspect, the at least one first trench includes a plurality of third trenches, the at least one second trench includes a plurality of fourth trenches, the second semiconductor layer includes a plurality of fourth semiconductor layers, the third trenches and the fourth trenches are alternately arranged, and the fourth semiconductor layers adjoin the third trenches along both sides of the third trenches.

According to the ninth aspect of the present invention, in the insulated gate semiconductor device of the fifth, sixth or seventh aspect, the at least one first trench includes a plurality of third trenches, the at least one second trench includes a plurality of fourth trenches, the second semiconductor layer includes a plurality of fourth semiconductor layers, the third trenches and the fourth trenches are alternately arranged, and the fourth semiconductor layers are disposed in such stripe shapes as to intersect the third trenches and the fourth trenches.

The present invention is also directed to a method of manufacturing a insulated gate semiconductor device. According to the tenth aspect of the present invention, the method comprises: (a) preparing a semiconductor substrate of a first conductivity type which has a first major surface and a second major surface; (b) implanting and diffusing an impurity of a second conductivity type in low concentration in the first major surface of the semiconductor substrate to form a first semiconductor layer; (c) further implanting and diffusing an impurity of the second conductivity type in higher concentration than that of the step (b) in a surface of the first semiconductor layer to form a second semiconductor layer; (d) forming a resist pattern over a surface of the second semiconductor layer with at least one first opening made by removing a portion of the surface of the second semiconductor layer; (e) still further implanting and diffusing an impurity of the first conductivity type in the surface of the second semiconductor layer through the at least one first opening by using the resist pattern as a mask, to form a third semiconductor layer; (f) forming a shield film over the surface of the second semiconductor layer and a surface of the third semiconductor with at least one second opening to define a portion of the surface of the third semiconductor layer; (g) removing a semiconductor in a vertical range from the surface of the third semiconductor to the semiconductor substrate through the at least one second opening by using the shield film as a mask, to form at least one trench; (h) forming an insulating film over a surface of the at least one trench; (i) layering a conductor over the insulating film to fill the at least one trench; (j) removing the conductor to be left in the at least one trench flatly at an opening portion thereof; (k) forming an insulating layer over the surfaces of the second and third semiconductor layers and a surface of the conductor buried in the at least one trench; (l) forming a resist pattern over the insulating layer with an opening on the surface of the second semiconductor layer and a portion of the surface of the third semiconductor layer; (m) removing the insulating layer through the opening of the resist pattern by using the resist pattern as a mask; (n) layering a conductor over the surface of the second semiconductor layer and the portion of the surface of the third semiconductor layer which are exposed by the step (m) to form a first main electrode; (o) layering a conductor over the second major surface of the semiconductor substrate to form a second main electrode; and (p) forming a control electrode to be electrically connected to the conductor buried in the at least one trench.

According to the eleventh aspect of the present invention, the method of the tenth aspect further comprises, after the step (g) before the step (h), the steps of: (q) forming an oxide film over an inside wall of the at least one trench to remove the impurity of the second conductivity type existing in a surface region of the inside wall of the at least one trench in the first semiconductor layer; and (r) removing the oxide film formed over the inside wall of the at least one trench.

According to the twelfth aspect of the present invention, in the method of the tenth or eleventh aspect, the at least one first opening of the resist pattern formed in the step (d) includes a plurality of third openings of stripe shape arranged in parallel with each other, and the at least one second opening of the shield film formed in the step (f) includes a plurality of fourth openings disposed on the third semiconductor layers of stripe shape which are formed through the third openings in the step (e), along the direction of the length in such stripe shapes as to be narrower than the third semiconductor layers.

According to the thirteenth aspect of the present invention, in the method of the tenth or eleventh aspect, the at least one first opening of the resist pattern formed in the step (d) includes a plurality of third openings of stripe shape arranged in parallel with each other at a prescribed pitches, and the at least one second opening of the shield film formed in the step (f) includes a plurality of fourth openings disposed on the third semiconductor layers which are formed through the third openings in the step (e), in such stripe shapes as to intersect the third semiconductor layers.

According to the fourteenth aspect of the present invention, a method of manufacturing a insulated gate semiconductor device comprises the steps of: (a) preparing a semiconductor substrate of a first conductivity type which has a first major surface and a second major surface; (b) implanting and diffusing an impurity of a second conductivity type in the first major surface of the semiconductor substrate to form a first semiconductor layer; (c) forming a first resist pattern over a surface of the first semiconductor layer with at least one first opening made by removing a portion of the surface of the first semiconductor layer; (d) further implanting and diffusing an impurity of the first conductivity type in the surface of the first semiconductor layer through the first resist pattern with the at least one first opening as a mask, to form at least one second semiconductor layer; (e) forming a shield film over the surface of the first semiconductor layer and a surface of the second semiconductor with at least one second opening extending on the surface of the first semiconductor layer and at least one third opening on a portion of the surface of the second semiconductor layer; (f) removing semiconductors in a vertical range from the surface of the first or second semiconductor layer to the semiconductor substrate by using the shield film with the second and third resist as a mask, to form a first trench and a second trench corresponding to the at least one second opening and the at least one third opening, respectively; (g) forming an insulating film over a surface of the first trench and a surface of the second trench; (h) layering a first conductor over the insulating film to fill the first trench and the second trench; (i) removing the first conductor to be left in the first trench and the second trench flatly at opening portions thereof; (j) forming an insulating layer over the shield film and a surface of the first conductor buried in the first trench and the second trench; (k) forming a second resist pattern over a surface of the insulating layer with a fourth opening to define the surface of the first semiconductor layer, a portion of the surface of the second semiconductor layer and the surface of the first conductor buried in the first trench; (l) removing the insulating layer by using the second resist pattern with the fourth opening as a mask; (m) layering a second conductor over the surface of the first semiconductor layer, the portion of the surface of the second semiconductor layer and the surface of the first conductor buried in the first trench which are exposed by the step (l) to form a first main electrode; (n) layering a third conductor over the second major surface of the semiconductor substrate to form a second main electrode; and (n) forming a control electrode to be electrically connected to the first conductor buried in the second trench.

According to the fifteenth aspect of the present invention, the method of the fourteenth aspect, further comprises (p)

implanting and diffusing an impurity of the second conductivity type in low concentration in the semiconductor substrate at bottom portions of the first and second trenches through the shield film with the at least one second opening and the at least one third opening as a mask.

According to the sixteenth aspect of the present invention, in the method of the fourteenth or fifteenth aspect, the at least one first opening of the first resist pattern formed in the step (c) includes a plurality of fifth openings of stripe shape arranged at prescribed pitches, the at least one second semiconductor layer includes a plurality of fourth semiconductor layers of stripe shape which are formed through the fifth openings, the at least one second opening and the at least one third opening of the shield film formed in the step (e) include a plurality of sixth and seventh openings, respectively, which are alternately arranged in parallel with each other, and the seventh openings are disposed on the fourth semiconductor layers along the direction of the length in such stripe shapes as to be narrower than the fourth semiconductor layers.

According to the seventeenth aspect of the present invention, in the method of the fourteenth or fifteenth aspect, the at least one first opening of the first resist pattern formed in the step (c) includes a plurality of fifth openings of stripe shape arranged at prescribed pitches, the at least one second semiconductor layer includes a plurality of fourth semiconductor layers of stripe shape which are formed through the fifth openings, the at least one second opening and the at least one third opening of the shield film used in the step (e) include a plurality of sixth and seventh openings, respectively, which are alternately arranged in parallel with each other, and the seventh openings are arranged in such stripe shapes as to intersect the fourth semiconductor layers.

According to the eighteenth aspect of the present invention, a method of manufacturing a insulated gate semiconductor device comprises the steps of: (a) preparing a semiconductor substrate of a first conductivity type which has a first major surface and a second major surface; (b) implanting and diffusing an impurity of a second conductivity type in the first major surface of the semiconductor substrate to form a first semiconductor layer; (c) forming a first resist pattern over a surface of the first semiconductor layer with at least one first opening made by removing a portion of the surface of the first semiconductor layer; (d) further implanting and diffusing an impurity of the first conductivity type in the surface of the first semiconductor layer through the first resist pattern with the at least one first opening as a mask, to form a second semiconductor layer; (e) forming a first shield film over the surface of the first semiconductor layer and a surface of the second semiconductor with at least one second opening on a portion of the surface of the first semiconductor layer; (f) removing semiconductors in a vertical range from the surface of the first semiconductor layer to the semiconductor substrate by using the first shield film with the second opening as a mask, to form a first trench having an opening at the surface of the first semiconductor layer; (g) still further implanting and diffusing an impurity of the second conductivity type in low concentration in the semiconductor substrate at a bottom portion of the first trench through the first shield film with the at least one second opening as a mask; (h) forming a first insulating film over a surface of the first trench; (i) layering a first conductor over the first insulating film to fill the first trench; (j) removing the first conductor to be left in the first trench flatly at an opening portion thereof; (k) forming a second shield over a surface of the first conductor buried in the first trench and the surfaces of the first and second semiconductor layers with at least one third opening on a portion of the surface of the second semiconductor layer; (l) removing a semiconductor in a vertical range from the surface of the second semiconductor layer to the semiconductor substrate by using the second shield film with the at least one third opening as a mask, to form a second trench having an opening at the surface of the second semiconductor layer; (m) forming a second insulating film over a surface of the second trench; (n) layering a second conductor over the second insulating film to fill the second trench; (o) removing the second conductor to be left in the second trench flatly at an opening portion thereof; (p) forming an insulating layer over the surfaces of the first and second semiconductor layers and surfaces of the first and second conductors buried in the first and second trenches, respectively; (q) forming a second resist pattern over the insulating layer with a fourth opening on the surface of the first semiconductor layer, a portion of the surface of the second semiconductor layer and the surface of the first conductor buried in the first trench; (r) removing the insulating layer by using the second resist pattern with the fourth opening as a mask; (s) layering a third conductor over the surface of the first semiconductor layer, the portion of the surface of the second semiconductor layer and the surface of the first conductor buried in the first trench which are exposed in the step (r) to form a first main electrode; (t) layering a fourth conductor over the second major surface of the semiconductor substrate; and (u) forming a control electrode electrically connected to the second conductor buried in the trench.

According to the ninteenth aspect of the present invention, in the method of the eighteenth aspect, the at least one first opening of the first resist pattern formed in the step (c) includes a plurality of fifth openings of stripe shape arranged at prescribed pitches, the at least one second semiconductor layer includes a plurality of fourth semiconductor layers of stripe shape which are formed through the fifth openings, the at least one second opening and the at least one third opening of the shield film formed in the step (e) include a plurality of sixth and seventh openings, respectively, which are alternately arranged in parallel with each other, and the seventh openings are disposed on the fourth semiconductor layers along the direction of the length in such stripe shapes as to be narrower than the fourth semiconductor layers.

According to the twentieth aspect of the present invention, in the method of the eighteenth aspect, the at least one first opening of the first resist pattern formed in the step (c) includes a plurality of fifth openings of stripe shape arranged at prescribed pitches; the second semiconductor layer includes a plurality of fourth semiconductor layers of stripe shape which are formed through the fifth openings, the at least one second opening and the at least one third opening of the shield film used in the step (e) include a plurality of sixth and seventh openings, respectively, which are alternately arranged in parallel with each other, and the seventh openings are arranged in such stripe shapes as to intersect the fourth semiconductor layers.

In the insulated gate semiconductor device according to the first aspect of the present invention, since the third semiconductor layer of the second conductivity type, the impurity concentration of which is lower than that of the first semiconductor layer, is disposed between the first major surface of the semiconductor substrate and the first semiconductor layer, the depletion layer extends to the third semiconductor layer to relieve the electric field concentration at the tip end portion of the trench when a voltage is applied across the first main electrode and the second main electrode, and therefore an insulated gate semiconductor device of high breakdown voltage can be provided.

In the insulated gate semiconductor device according to the second aspect of the present invention, since the third semiconductor layer is disposed facing the trench with a portion of the semiconductor substrate between, the channel region of short length is formed on the first semiconductor layer and accordingly the ON-resistance can be reduced. Therefore, it is possible to provide an insulated gate semiconductor device of high breakdown voltage and low power consumption.

In the insulated gate semiconductor device according to the third aspect of the present invention, since the fourth semiconductor layers adjoin a plurality of trenches along both the sides of the opening and the two fourth semiconductor layers existing between the adjacent trenches sandwich the first semiconductor layer, a plurality of cell regions are formed and therefore an element of large current capacity can be provided.

In the insulated gate semiconductor device according to the fourth aspect of the present invention, since a plurality of fifth semiconductor layers are arranged in parallel, intersecting the openings of a plurality of trenches, a large number of cell regions are obtained and therefore an element of large current capacity can be provided.

Since the insulated gate semiconductor device according to the fifth aspect of the present invention comprises the first trench including the first conductor electrically connected to the control electrode and the second trench including the second conductor short circuited to the first main electrode, the spacing between the trenches can be lessened by disposing a second trench between adjacent first trenches, and the interference of electric fields occurs between the respective tip end portions of the first and second trenches, causing the electric fields to draw each other, to relieve the electric fields at the respective tip end portions. Therefore, it is possible to provide an insulated gate semiconductor device of high breakdown voltage.

In the insulated gate semiconductor device according to the sixth aspect of the present invention, since the third semiconductor layer of the second conductivity type, the impurity concentration of which is lower than that of the first semiconductor layer, is disposed in a portion of the semiconductor layer facing at least the first or the second conductor at the bottom portion of the trench with the first or second insulating film between, the interference of electric fields easily occurs between the tip end portions of the adjacent trenches to further relieve the electric fields at the tip end portions of the trenches. Therefore, it is possible to provide an insulated gate semiconductor device of higher breakdown voltage.

In the insulated gate semiconductor device according to the seventh aspect of the present invention, since the third semiconductor layers are so disposed as to be opposed to only the second conductor in the second trench, the ON-resistance can be suppressed and therefore an insulated gate semiconductor device of high breakdown voltage and low power consumption can be provided.

In the insulated gate semiconductor device according to the eighth aspect of the present invention, since the third and fourth trenches are alternately arranged and the second semiconductor layers adjoin the third trenches along both the sides of the third trenches, a wide channel is formed to thereby achieve an element of high current density, thus ensuring an insulated gate semiconductor device of large current capacity.

In the insulated gate semiconductor device according to the ninth aspect of the present invention, since the third and fourth trenches are alternately arranged and a plurality of fourth semiconductor layers are disposed in such stripe shapes as to intersect the third and fourth trenches, a plurality of trenches can be provided with a narrow pitch, thus achieving a cell configuration of high density and large current capacity.

Since the method of manufacturing the insulated gate semiconductor device according to the tenth aspect of the present invention comprises the step of implanting and diffusing the impurity of the second conductivity type in low concentration in the major surface of the semiconductor substrate to form the first semiconductor layer and the step of implanting and diffusing the impurity of the second conductivity type in higher concentration in the surface of the first semiconductor layer, the first semiconductor layer of the second conductivity type, the impurity concentration of which is lower than that of the second semiconductor layer, is formed between the major surface of the semiconductor substrate and the second semiconductor layer. Therefore an insulated gate semiconductor device of high breakdown voltage can be provided.

Since the method of manufacturing the insulated gate semiconductor device according to the eleventh aspect of the present invention further comprises, after the step of removing the semiconductor, the step of forming the oxide film over the inside wall of the trench to remove the impurity of the second conductivity type in the surface region of the inside wall of the trench in the first semiconductor layer and the step of removing the oxide film, the third semiconductor layer can be so disposed as to be opposed to the trench with a portion of the semiconductor substrate therebetween. Therefore, it is possible to provide an insulated gate semiconductor device of high breakdown voltage and low power consumption.

Since the method of manufacturing the insulated gate semiconductor device according to the twelfth aspect of the present invention comprises the implantation step using the resist pattern with a plurality of third openings arranged in parallel and the removing step using the shield film with a plurality of fourth openings of narrower stripe shape positioned correspondingly to the third openings along the direction of the length, the second semiconductor layer is so formed as to extend along the both sides of a plurality of trenches and two second semiconductor layers between the adjacent trenches sandwich the first semiconductor layer. Therefore, an insulated gate semiconductor device of large current capacity, consisting of elements of high current density, can be provided.

Since the method of manufacturing the insulated gate semiconductor device according to the thirteenth aspect of the present invention comprises the implantation step using the resist pattern with a plurality of third openings of stripe shape arranged at prescribed pitches and the removing step using the shield film with a plurality of fourth openings of stripe shape in such stripe shapes as to intersect the third openings, it is possible to form the second semiconductor layer including regions which extend in parallel, intersecting the trenches. Therefore, an insulated gate semiconductor device having a cell configuration of high density can be provided.

Since the method of manufacturing the insulated gate semiconductor device according to the fourteenth aspect of the present invention comprises the step of implanting and diffusing the impurity of the first conductivity type through the first resist pattern formed over the first semiconductor layer with the first opening made by removing a portion of the surface of the first semiconductor layer as a mask to form the second semiconductor layer and the step of removing the semiconductors in a vertical range from the surface of the second semiconductor layer to the semiconductor substrate by using the shield film formed over the second semiconductor layer with the second opening extending on the surface of the first semiconductor layer and the third opening to define a portion of the surface of the second semiconductor layer as a mask, it is possible to form the first semiconductor layer of the second conductivity type over the first major surface of the semiconductor substrate of the first conductivity type, a plurality of trenches consisting of the first trench and the second trench each having an opening at the surface of the first semiconductor layer, arranged in parallel with each other reaching the semiconductor substrate in the vertical direction, the insulating films over the inside walls of the trenches, the conductors inside the trenches so as to be opposed to the first semiconductor layer with the insulating films therebetween and the second semiconductor layer of the first conductivity type on a portion of the surface of the first semiconductor layer so as to be opposed to the conductor in the first trench with the insulating film of the first trench therebetween. Therefore, an insulated gate semiconductor device of high breakdown voltage can be provided.

Since the method of manufacturing the insulated gate semiconductor device according to the fifteenth aspect of the present invention further comprises, subsequently to the step of removing the semiconductors, the step of implanting and diffusing the impurity of the second conductivity type in low concentration in the semiconductor substrate at the bottom portion of the first and second trench by using the shield film with the second and third openings, it is possible to form the third semiconductor layer of the second conductivity type, the impurity concentration of which is lower than that of the first semiconductor layer in portions of the semiconductor substrate facing the conductors at the bottom portions of the first and second trenches with the insulating films between. Therefore, an insulated gate semiconductor device of higher breakdown voltage can be provided.

The method of manufacturing the insulated gate semiconductor device according to the sixteenth aspect of the present invention comprises the implantation step using the first resist pattern with a plurality of fifth openings of stripe shape disposed at prescribed pitches to form a plurality of fourth semiconductor layers and the step of removing the semiconductors in a vertical range from the surface of the fourth semiconductor layers to the semiconductor substrate by using the shield film formed on the first semiconductor layer and the fourth semiconductor layers with a plurality of sixth openings each extending on the surface of the first semiconductor layer and a plurality of seventh openings to each define a portion of the surface of the fourth semiconductor layer, and the sixth openings and the seventh openings are alternately arranged in parallel and the seventh openings are disposed on the fourth semiconductor layers along the direction of the length, each being narrower than each of the fourth semiconductor layers. That allows a plurality of cells to be formed and therefore an insulated gate semiconductor device of large current capacity, consisting of elements of high current density, can be provided.

Furthermore, assuming that the shield film used in the removing step is put on the first resist pattern, the seventh openings extend correspondingly to the fifth openings along the direction of the length in such stripe shapes as to be narrower than the fifth openings and the sixth openings and the seventh openings are alternately arranged in parallel.

The method of manufacturing the insulated gate semiconductor device according to the seventeenth aspect of the present invention comprises the implantation step using the first resist pattern with a plurality of fifth openings of stripe shape arranged in parallel to form a plurality of fourth semiconductor layers, and the sixth openings and the seventh openings are arranged in parallel with each other and the seventh openings are disposed in such stripe shapes as to intersect the fourth semiconductor layers. That allows a plurality of cells to be formed and therefore an insulated gate semiconductor device of small size, consisting of densely-arranged elements, can be provided.

Furthermore, assuming that the shield film used in the removing step is put on the first resist pattern, the seventh openings extend in such stripe shape as to intersect the fifth openings and the sixth openings and the seventh openings are alternately arranged in parallel.

Since the method of manufacturing the insulated gate semiconductor device according to the eighteenth aspect of the present invention comprises the step of removing the semiconductor in a vertical range from the surface of the first semiconductor layer to the semiconductor substrate by using the first shield film formed on the surface of the first semiconductor layer and the surface of the second semiconductor layer with a second opening to define a portion of the surface of the first semiconductor layer as a mask to form the first trench having an opening at the surface of the first semiconductor layer, the step of implanting the impurity of the second conductivity type in low concentration in the semiconductor substrate at the bottom portion of the first trench through the first shield film with the second opening, the step of forming the first insulating film over the surface of the first trench, the step of layering the first conductor over the first insulating film to fill the first trench, the step of removing the first conductor to be left in the first trench flatly at the opening portion, the step of forming the second shield film over the surface of the first conductor and the surfaces of the first and second semiconductor layers with the third opening to define a portion of the surface of the second semiconductor layer, the step of removing the semiconductor in a vertical range from the surface of the second semiconductor layer to the semiconductor substrate by using the second shield film with the third opening to form the second trench having an opening at the surface of the second semiconductor layer, the step of forming the second insulating film over the surface of the second trench, the step of layering the second conductor over the second insulating film to fill the second trench, the step of removing the second conductor to be left in the second trench flatly at the opening portion and the step of forming the insulating layer over the first and second semiconductor layers and the first and second conductors buried in the first and second trenches respectively, the third semiconductor layer of the second conductivity type, the impurity concentration of which is lower than that of the first semiconductor layer, is formed on a portion of the semiconductor substrate facing the second conductor at the bottom portion of the second trench with the second insulating film between. Therefore, an insulated gate semiconductor device of high breakdown voltage and low power consumption can be provided.

The method of manufacturing the insulated gate semiconductor device according to the nineteenth aspect of the present invention comprises the implantation step using the first resist pattern with a plurality of fifth openings of stripe shape arranged at prescribed pitches to form a plurality of fourth semiconductor layers and the step of removing the semiconductors in a vertical range from the surfaces of the first and fourth semiconductor layers to the semiconductor substrate by using the shield film with a plurality of sixth openings extending on the surface of the first semiconductor layer and a plurality of seventh openings to each define a portion of the surface of the fourth semiconductor layer as a mask, and the sixth openings and the seventh openings are alternately arranged in parallel and the seventh openings are disposed on the fourth semiconductor layers along the direction of the length in such stripe shapes as to be narrower than the fourth semiconductor layers. That allows a plurality of cells to be formed and therefore an insulated gate semiconductor device of high current density and large current capacity can be provided.

Furthermore, assuming that the second shield film used in the removing step is put on the first resist pattern, the seventh openings extend correspondingly to the fifth openings along the direction of the length in such stripe shapes as to be narrower than the fifth openings, and a plurality of portions corresponding to the sixth openings of the first shield film and a plurality of portions corresponding to the seventh openings of the second shield film are alternately arranged in parallel.

The method of manufacturing the insulated gate semiconductor device according to the twentieth aspect of the present invention comprises the implantation step using the first resist pattern with a plurality of fifth openings of stripe shape arranged at prescribed pitches, and the sixth openings and the seventh openings are arranged in parallel with each other and the seventh openings are disposed in such stripe shapes as to intersect the fourth semiconductor layers. That allows a plurality of cells to be formed and therefore an insulated gate semiconductor device of small size, consisting of densely-arranged elements, can be provided.

Furthermore, assuming that the second shield film used in the removing step is put on the first resist pattern, the seventh openings extend in such stripe shapes as to intersect the fifth openings and a plurality of portions corresponding to sixth openings of the first shield film and a plurality of portions corresponding to the seventh openings of the second shield film are alternately arranged in parallel.

An object of the present invention is to provide an insulated gate semiconductor device which is capable of preventing reduction in breakdown voltage while keeping the ON-resistance low and a method of manufacturing the same.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 37 to 48 are fragmentary cross-sectional views each showing a device in each step of a process of manufacturing the insulated gate semiconductor device of the present invention;

DESCRIPTION OF THE PREFERRED EMBODIMENTS

<The First Preferred Embodiment>

Figure 1:
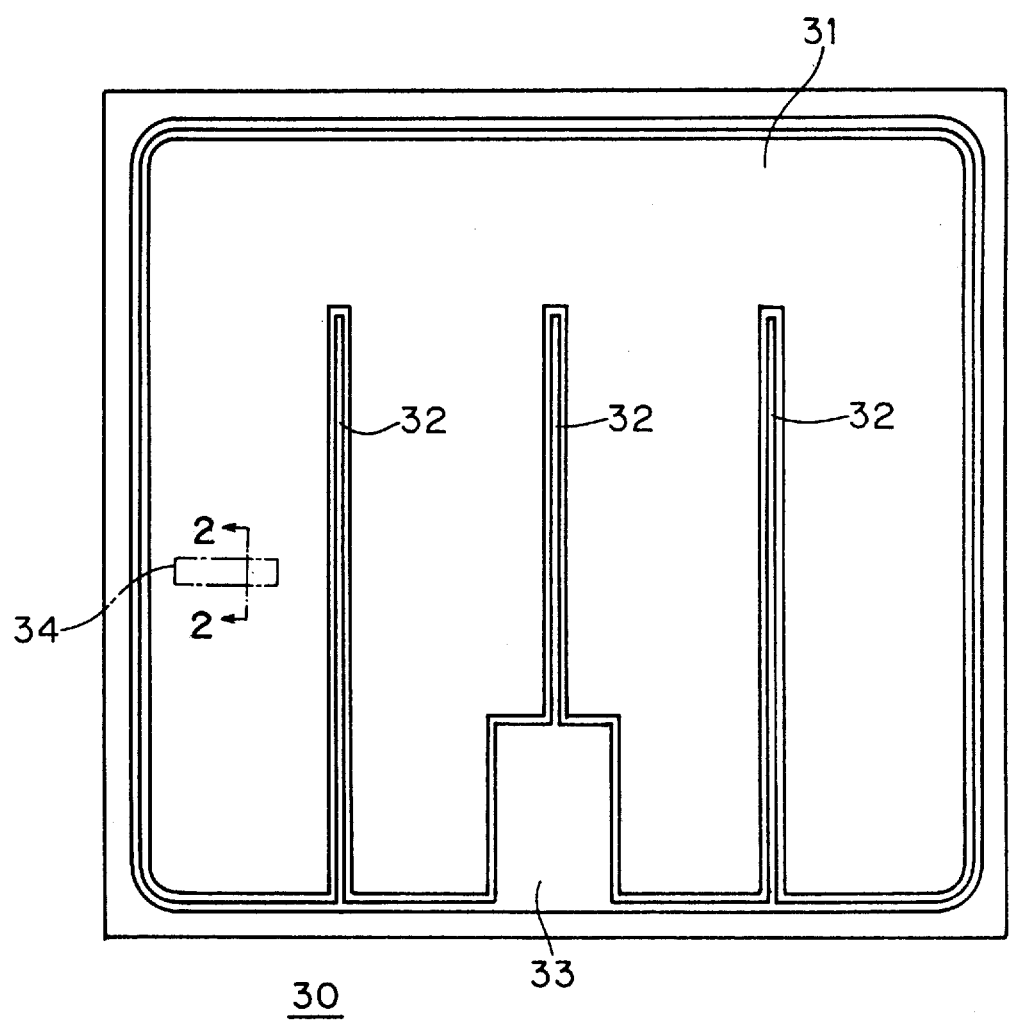
FIG. 1 is a plan view of an insulated gate semiconductor device in accordance with a first preferred embodiment of the present invention.

FIG. 1 is a plan view of an insulated gate semiconductor device in accordance with the first preferred embodiment of the present invention. A UMOS will be discussed as an example of the insulated gate semiconductor device.

Figure 2:
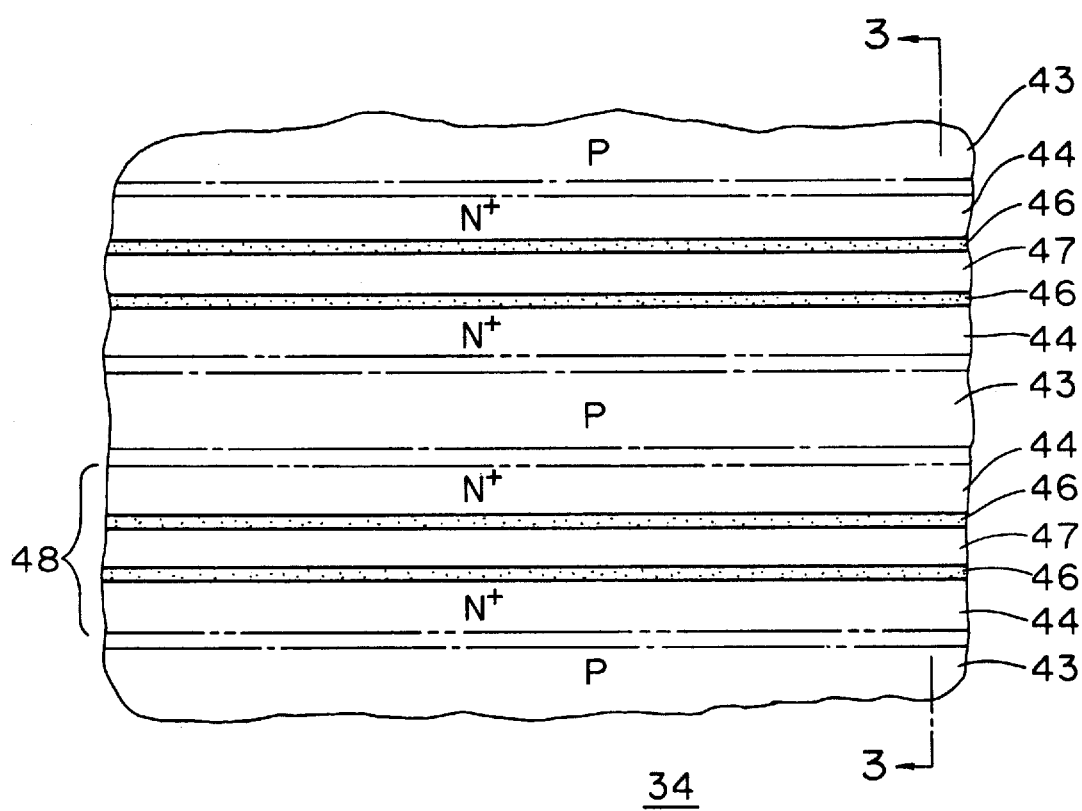
FIG. 2 is a fragmentary plan view of cells in the insulated gate semiconductor device of FIG. 1.
Figure 3:
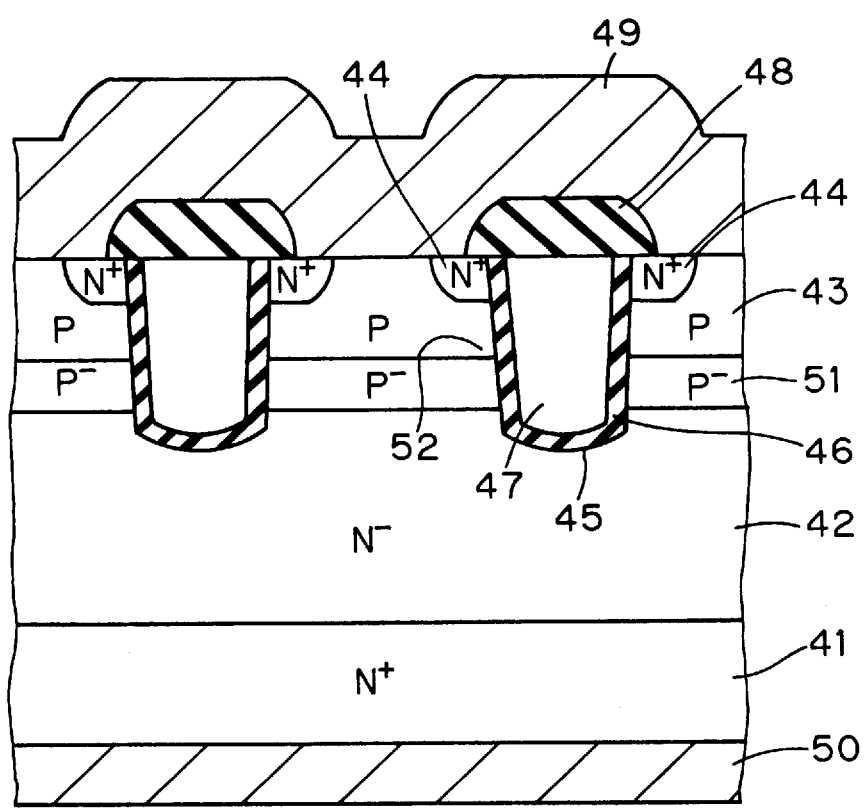
FIG. 3 is a fragmentary cross-sectional view taken along the section of A—A of FIG. 2.

FIG. 2 is a fragmentary plan view of cells of the UMOS of FIG. 1, and FIG. 3 is a fragmentary cross-sectional view taken along the section of A—A of FIG. 2. In FIG. 2, a source electrode 49 and an interlayer insulating film 48 of FIG. 3 are omitted.

A UMOS 30 as shown in FIG. 1 comprises a source electrode 31 as a first main electrode, a gate interconnection 32, a gate pad 33 as a control electrode and a fragment 34 of the cells.

FIGS. 2 and 3 show a semiconductor substrate consisting of an $N^+$ substrate 41 and an $N^-$ layer 42, a P base layer 43 as a first semiconductor layer, an $N^+$ source region 44 as a second semiconductor layer, a trench 45, an insulating film 46, a polysilicon 47 as a conductor, an interlayer insulating film 48 as a insulating layer, a source electrode 49 as a first main electrode which is part of the source electrode 31 of FIG. 1, a drain electrode 50 as a second main electrode, a $P^-$ layer 51 as a third semiconductor layer and a channel region 52.

The insulating film 46 is generally a thermal oxide film formed of $SiO_2$, and the polysilicon 47 is doped with an impurity to serve as a gate. The interlayer insulating film 48 is formed of a silicate glass (hereinafter referred to as "BPSG") containing boron and phosphorus, the source electrode 49 is formed of a silicon-containing aluminum (hereinafter referred to as Al—Si) and the drain electrode 50 is formed of TiNiAu.

The gate interconnection 32, which is connected to the gate of the cell, serves to reduce polysilicon portions in a path from the gate to the gate pad, thus suppressing the electrical resistance between the gate and the gate pad, and further makes it possible to uniformly perform a control operation over the device on the whole.

In the UMOS of the first preferred embodiment, the $N^-$ layer 42 is formed on a surface of the $N^+$ substrate 41, the $P^-$ layer 51 is formed on the $N^-$ layer 42 and further the P base layer 43 is formed on the $P^-$ layer 51. The $N^+$ source regions 44 of stripe shape are formed on a surface of the P base layer 43, being spaced. Along the direction of the length of the stripe-shaped $N^+$ source region 44, the trench 45 is provided, extending in a vertical direction from the surface of the $N^+$ source region 44 to the $N^-$ layer 42. The insulating film 46 is formed over the inside wall of the trench 45 and the polysilicon 47 fills the trench 45 up to the opening portion at the surface of the $N^+$ source region 44. Between the adjacent trenches 45, there exists two $N^+$ source regions 44 which adjoin the trenches 45 respectively and an exposed portion of the P base layer 43 between the $N^+$ source regions 44.

The surface of the polysilicon 47 is covered with the interlayer insulating film 48. Over the surface of the device where the $N^+$ source regions 44 and the P base layer 43 are found, the source electrode 49 is provided so that the $N^+$ source region 44 and the P base layer 43 may be short circuited and the gate interconnection 32 connected to the polysilicon 47 and the gate pad 33 are further provided. The drain electrode 50 is provided on the other surface of the $N^+$ substrate 41.

For example, a device with a breakdown voltage of 60 V class has sizes as follows: a cell pitch is about 5 μm when the spacing between the adjacent trenches is about 3 μm, the thickness from the surface of the P base layer 43 to the bottom surface of the $N^-$ layer 42 is about 8.5 μm and the depth of the trench 45 is 2 to 3 μm. The tip portion of the trench 45 extends into the $N^-$ at a depth of about 0.5 μm, and the $N^+$ substrate 41 has a thickness of about 340 μm. As (arsenic) is generally used as an N-type impurity.

Now, an operation of the UMOS will be discussed.

When a prescribed drain voltage $V_{DS}$ is applied across the source electrode 49 and the drain electrode 50 and a prescribed gate voltage $V_{GS}$ is applied across the source electrode 49 and the gate 47, the insulating film 46 serves as a gate insulating film and the channel region 52 in the P base layer 43 and the $P^-$ layer 51 is inverted to N type in the vicinity of the insulating film 46, thus providing a path for electric charges, i.e., a channel. The channel produces continuity between the source and drain. In the On state, if the gate voltage $V_{GS}$ applied across the source electrode 49 and the gate 47 is changed to 0 V or reversely biased, the gate is turned off and the channel region 52 of N type is inverted again to P type, entering an OFF state where there is no continuity between the source and drain.

When the drain voltage $V_{DS}$ is applied in the OFF state, few depletion layer extends to the P base layer 43 without the $P^-$ layer 51. In this case, however, since the $P^-$ layer 51 is provided between the P base layer 43 and the $N^-$ layer 42, the depletion layer extends even to the $P^-$ layer 51. The depletion layer extending to the $P^-$ layer 51 stretches the potential distribution at the tip end portion of the trench 45 to relieve an electric field concentration, thus increasing the breakdown voltage of the device.

Figure 4:
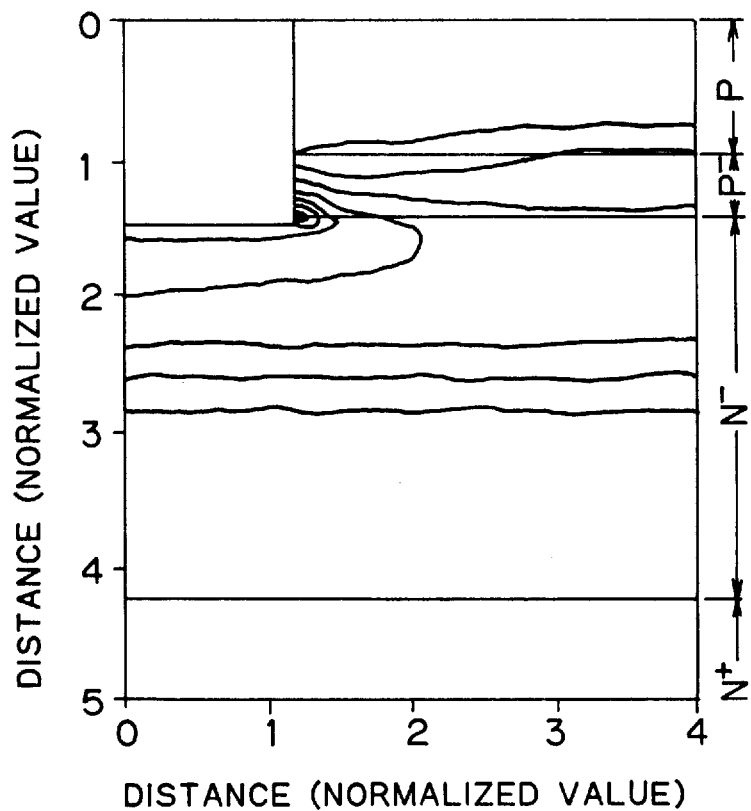
FIG. 4 is a graph showing an electric field when a drain voltage is applied to the insulated gate semiconductor device of the present invention.

FIG. 4 is a graph showing a result of a simulation of the electric field in the UMOS of the first preferred embodiment when the drain voltage is applied thereto.

In the simulation, it is assumed that the impurity concentration of the $N^-$ layer 42 is 1 Ωcm and the thickness from the surface of the P base layer 43 to the bottom surface of the $N^-$ layer 42 is 8.5 μm. The upper-left rectangular portion of FIG. 4 represents a portion of trench structure.

Figure 51:
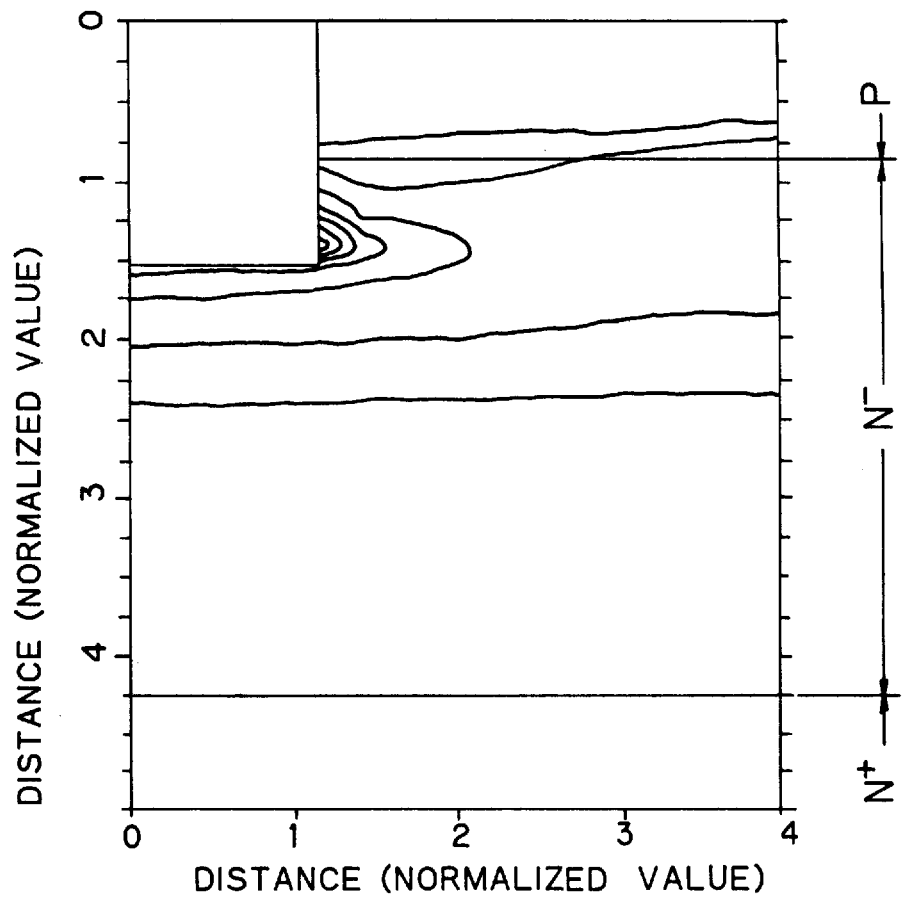
FIG. 51 is a graph showing an electric field when a drain voltage is applied to the insulated gate semiconductor device in the background art.
Figure 52:
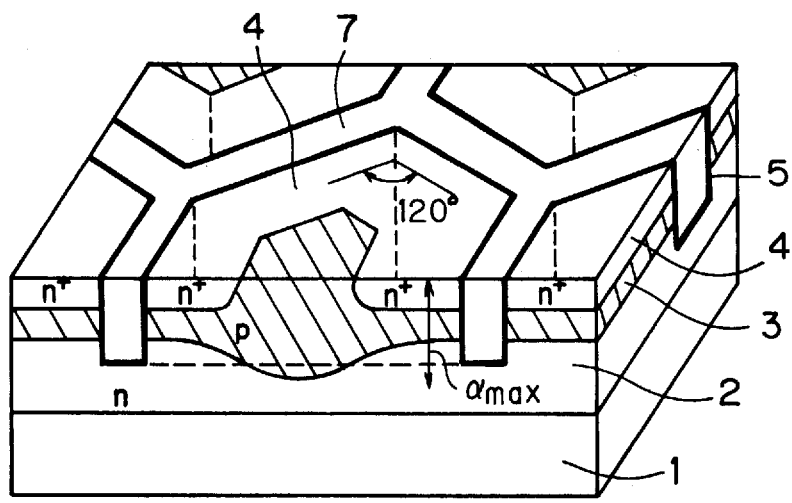
FIG. 52 is a fragmentary cross-sectional perspective view of the insulated gate semiconductor device in the background art.

As compared with FIG. 51 showing the electric field in the background art, it can be seen from FIG. 4 showing the electric field in the first preferred embodiment that the depletion layer extends to the $P^-$ layer 51 and the electric field is stretched in a horizontal direction to relieve the electric field concentration at the tip end portion of the trench 45.

The simulation reveals that the breakdown voltage of the device rises to 98 V with $P^-$ layer 51, while it is 82 V without the $P^-$ layer 51.

Moreover, since the above structure has no need to widen the spacing between the adjacent trenches 45 and makes it possible to narrow the spacing as far as the manufacturing process permits, the ON-voltage can be suppressed.

Furthermore, having an arrangement where the $N^+$ source region 44 is so disposed as to be adjacent to the trench 45 with the insulating film 46 between and extend along the trench 45 in the direction of its length, the device of the first preferred embodiment has a broadened gate width and a high current density.

Next, an exemplary method of manufacturing the UMOS of the first preferred embodiment will be discussed.

FIGS. 5 to 14 are fragmentary cross-sectional views each showing a device in each step of a process of manufacturing the insulated gate semiconductor device of the present invention.

Figure 5:
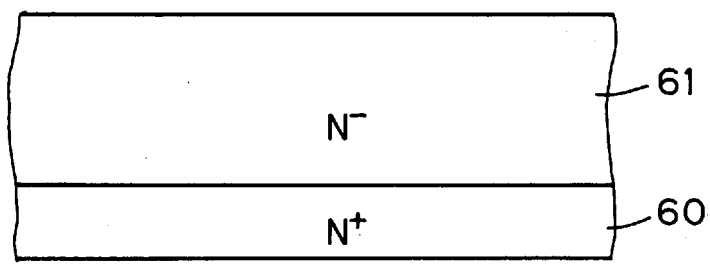
FIGS. 5 to 14 are fragmentary cross-sectional views each showing a device in each step of a process of manufacturing the insulated gate semiconductor device of the present invention.

First, an $N^+$ substrate 60 is prepared and an $N^-$ layer 61 is formed thereon (see FIG. 5).

Figure 6:
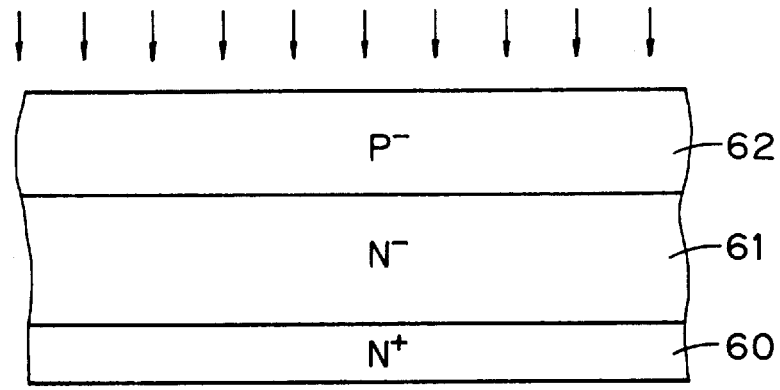

Next, a P-type impurity is implanted into the $N^-$ layer 61 and diffused therein to form a $P^-$ layer 62 (see FIG. 6).

Figure 7:
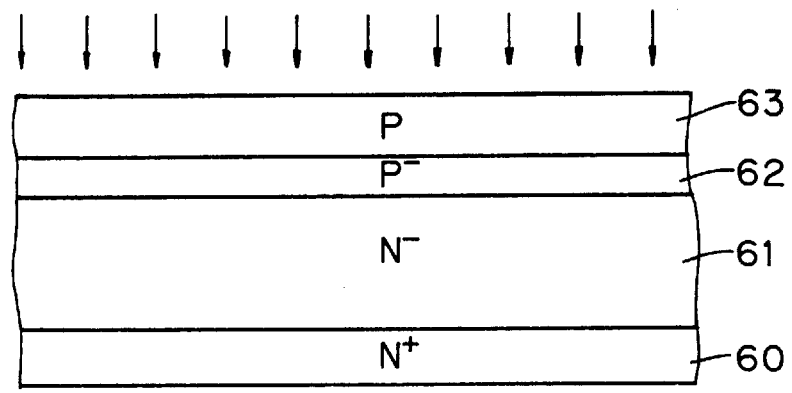
Figure 8:
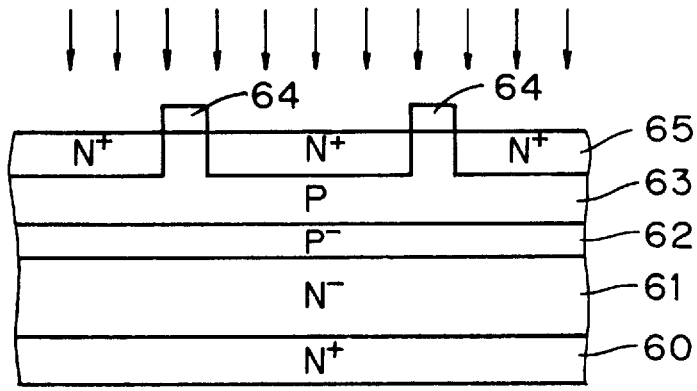

The P-type impurity is further implanted into a surface of the P⁻ layer 62 and is so diffused as to come into contact with the N⁻ layer 61 and keep a prescribed thickness of the P⁻ layer 62, thus forming a P base layer 63 (see FIG. 7). A resist is layered over a surface of the P base layer 63 and then a photolithographic process is performed to form a resist pattern 64 having a plurality of stripe-shaped openings arranged in parallel as first openings. An N-type impurity is implanted in high concentration to the surface of the P base layer 63 through the resist pattern 64 as a mask and diffused therein to form N⁺ source regions 65 (see FIG. 8).

After that, an oxide film 66 is formed over the surfaces of the P base layer 63 and the N⁺ source regions 65 as a shield film, and a silicon etching mask is formed of the oxide film 66, having stripe-shaped openings on the surfaces of the N⁺ source regions 65 as second openings, each of which is narrower in width than each N⁺ source region 65. An etching is performed through RIE (Reactive Ion Etching) by using the silicon etching mask to form trenches 67 each of which extends from the surface of the N⁺ region 65 to the N⁻ layer 61 (see FIG. 9).

Next, a thermal oxide film is formed over the surfaces of the trenches 67. A polysilicon 69 doped with the P-type impurity is layered on the oxide film over the surfaces of the P base layer 63, the N⁺ source regions 65 and the trenches 67, to fill the trenches 67, (see FIG. 10).

Figure 11:
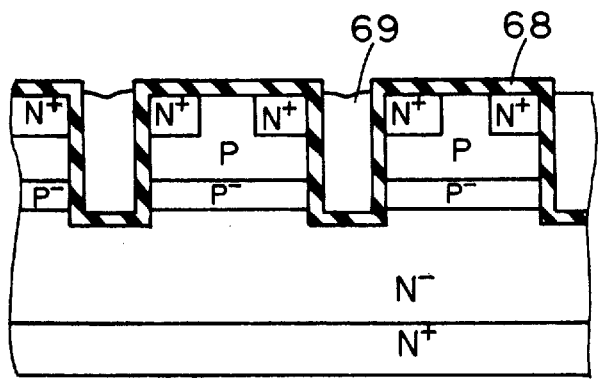

The layered polysilicon 69 is etched back to the opening portion of the trench 67 so as to leave the polysilicon 69 filling the trench 67 (see FIG. 11).

Figure 12:
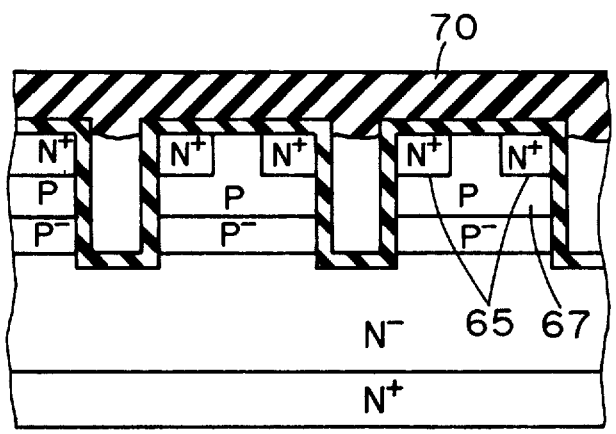
Figure 13:
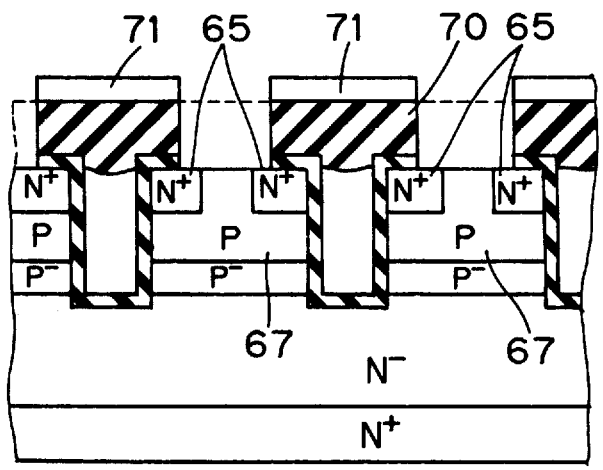
Figure 14:
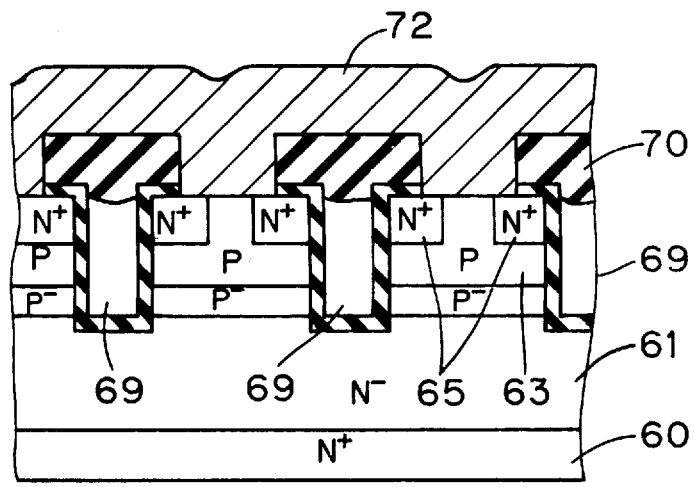

After that, a BPSG 70 is layered over the surface of the oxide film 68 formed over the surfaces of the P base layer 63 and the N⁺ source regions 65 and over the surface of the polysilicon 69 buried in the trench 67 (see FIG. 12).

Next, a resist 71 is layered over the BPSG 70 and then a photolithographic process is performed to form a resist pattern having stripe-shaped openings arranged in parallel with the trench 67 to cover the P base layer between the adjacent trenches 67 and part of the N⁺ source regions 65. The BPSG 70 and the oxide film 68 are etched by using the resist pattern as a mask, to form an interlayer insulating film 70 over the surface of the polysilicon 69 buried in the trench 67, (see FIG. 13).

An Al—Si 72 is layered over the surface of the device where the P base layer 63, the N⁺ source regions 65 and the interlayer insulating film 70 are found so that an exposed portion of the P base layer 63 which is made by etching and the N⁺ source region 65 may be short circuited. At the same time, a source electrode and a gate interconnection connected to the polysilicon 69 and a gate pad are formed (see FIG. 14).

Further, a drain electrode is formed over the other surface of the N⁺ substrate 60.

<The Second Preferred Embodiment>

Figure 15:
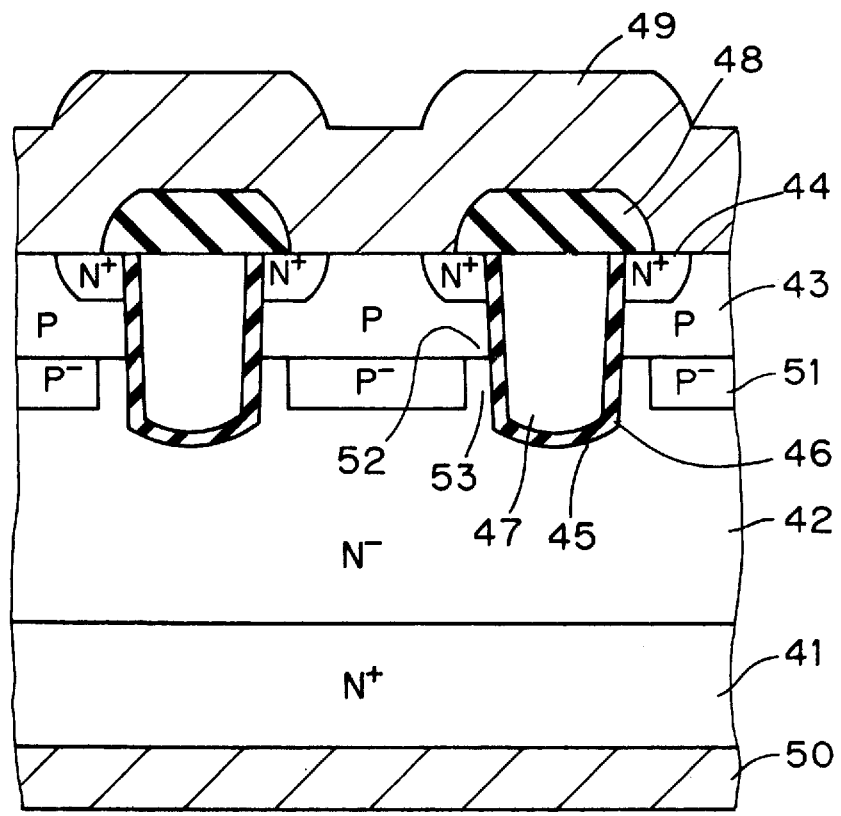
FIG. 15 is a fragmentary cross-sectional view of an insulated gate semiconductor device in accordance with a second preferred embodiment of the present invention.

FIG. 15 is a fragmentary cross-sectional view of a UMOS as an example in accordance with the second preferred embodiment of the present invention.

In FIG. 15, the P⁻ layers 51 are opposed to the insulating film 46 of the trench 45 with the N⁻ layer 42 therebetween. Other structural features are the same as those of the UMOS of the first preferred embodiment.

As discussed with respect to the operation in the first preferred embodiment, the prescribed drain voltage $V_{DS}$ is applied across the source electrode 49 and the drain electrode 50 and the prescribed gate voltage $V_{GS}$ is applied across the source electrode 49 and the gate 47, the P-type semiconductor layer in vicinity of the insulating film 46 is inverted to N type thus forming a path for electric charges, i.e., a channel that produces continuity between the source and drain. Specifically, the P base layer 43 and the P⁻ layer 51 are inverted to N type as the channel region 52 to form a channel serving as a path for electric charges in the first preferred embodiment. In the second preferred embodiment, only the P base layer 43 is inverted to N type to serve as the channel region 52 and accordingly the channel region 52 becomes shorter, not including the P⁻ layer 51, the impurity concentration of which is lower than that of the P base layer 43. Therefore, the ON-resistance decreases by the P⁻ layer 51 of lower impurity concentration not included in the channel region 52 as compared with the UMOS of the first preferred embodiment.

Figure 16:
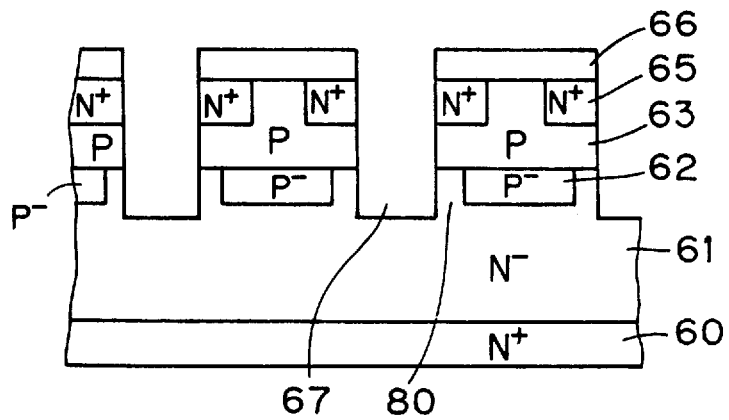
FIG. 16 is a fragmentary cross-sectional view of a device in a process of manufacturing the insulated gate semiconductor device of the present invention.

FIG. 16 is a fragmentary cross-sectional view of a UMOS in a manufacturing process in accordance with of the second preferred embodiment.

Figure 9:
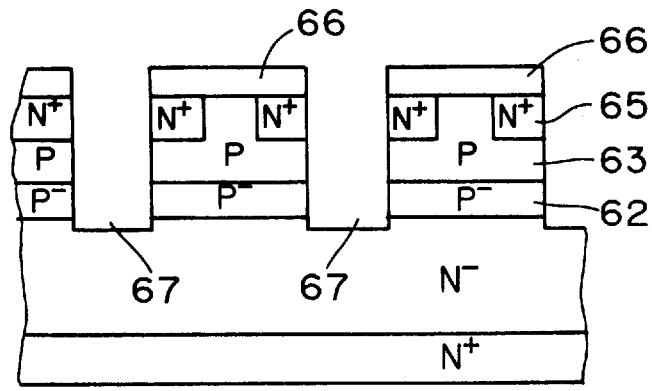
Figure 10:
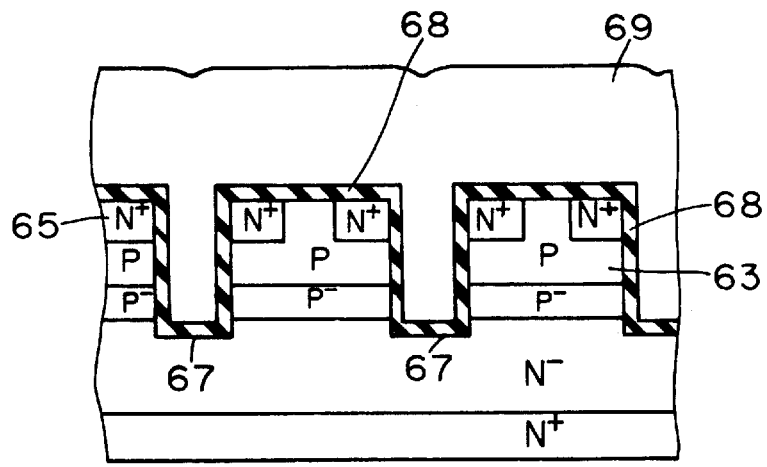

In a method of manufacturing the UMOS in the second preferred embodiment, a certain step is added to the method of manufacturing the UMOS in the first preferred embodiment. Specifically, the manufacturing process goes in a like manner until the step of forming the trench 67 as shown in FIG. 9, and subsequently an oxidation step is performed after removing the silicon etching mask, to draw a P-type impurity from the surface of the P⁻ layer 62 which is exposed in the side wall of the trench 67 into an oxide film. An etching is performed after the oxidation step to remove the oxide film which includes the P-type impurity. By repetition of the oxidation step and the etching step, a portion 80 adjacent to the trench 67, which is formerly part of the P⁻ layer 62, is cleared of the P-type impurity to become the same as the N⁻ layer 61 which does not experience the P-type impurity implantation (see FIG. 16).

Subsequently, in the same manner as the method of manufacturing the UMOS of the first preferred embodiment, the thermal oxide film is formed over the surfaces of the trenches 67, and then the polysilicon 69 doped with the P-type impurity is layered on the oxide film 68 over the surfaces of the P base layer 63, the N⁺ source regions 65 and the trenches 67, to fill the trench 67. The following steps are the same as those in the first preferred embodiment.

<The Third Preferred Embodiment>

Figure 17:
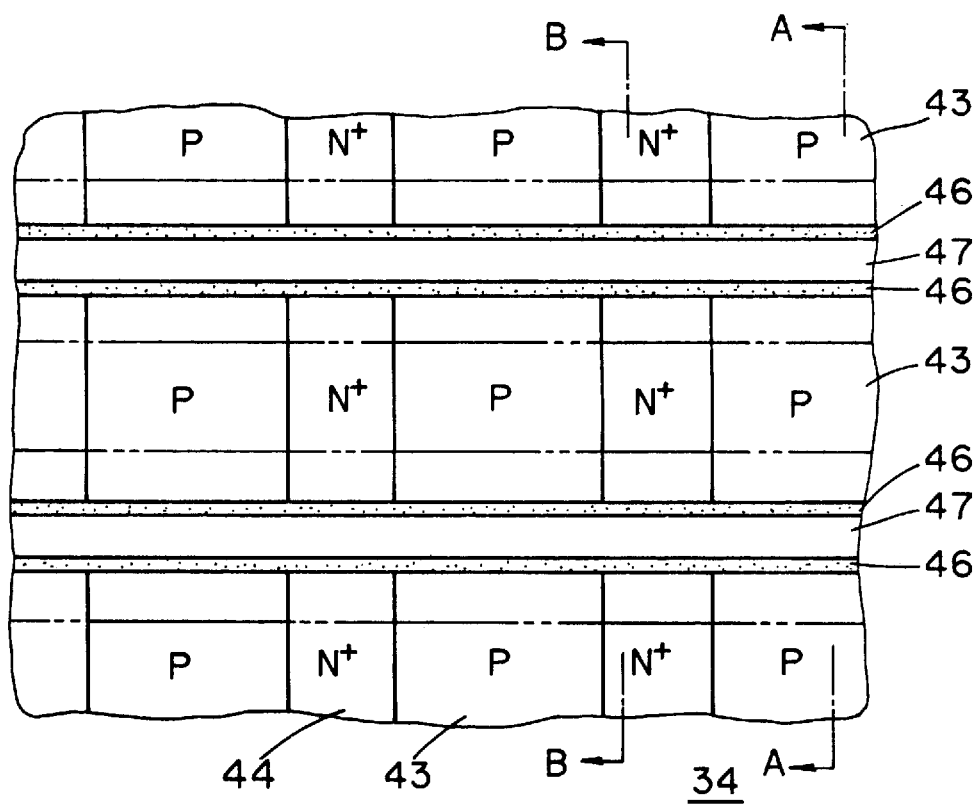
FIG. 17 is a fragmentary plan view of an insulated gate semiconductor device in accordance with a third preferred embodiment of the present invention.
Figure 18:
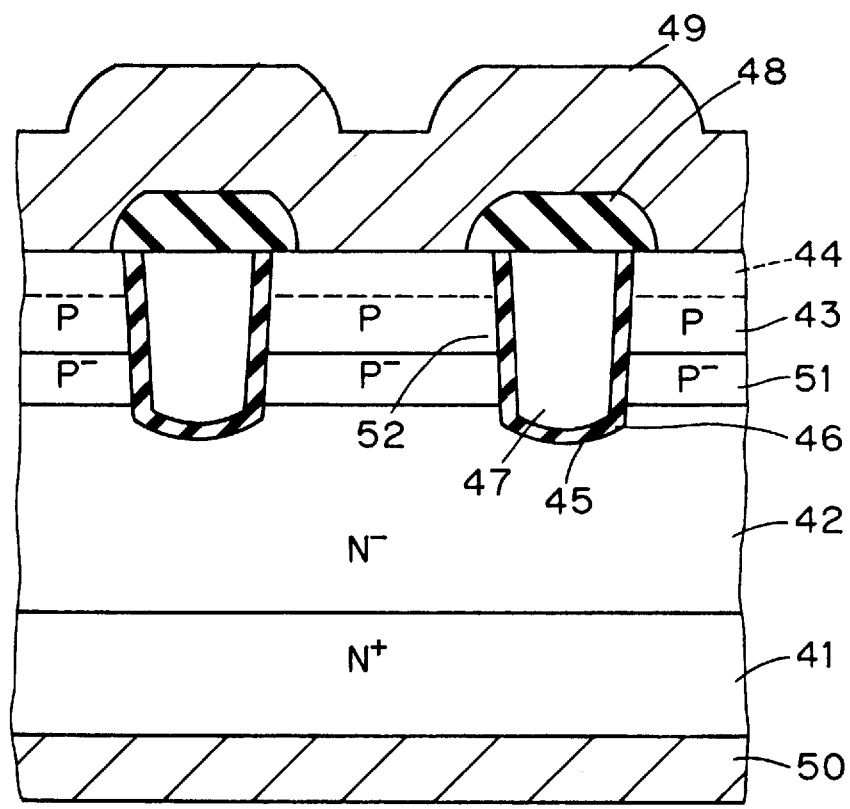
FIG. 18 is a fragmentary cross-sectional view of the insulated gate semiconductor device taken along the section of A—A of FIG. 17.
Figure 19:
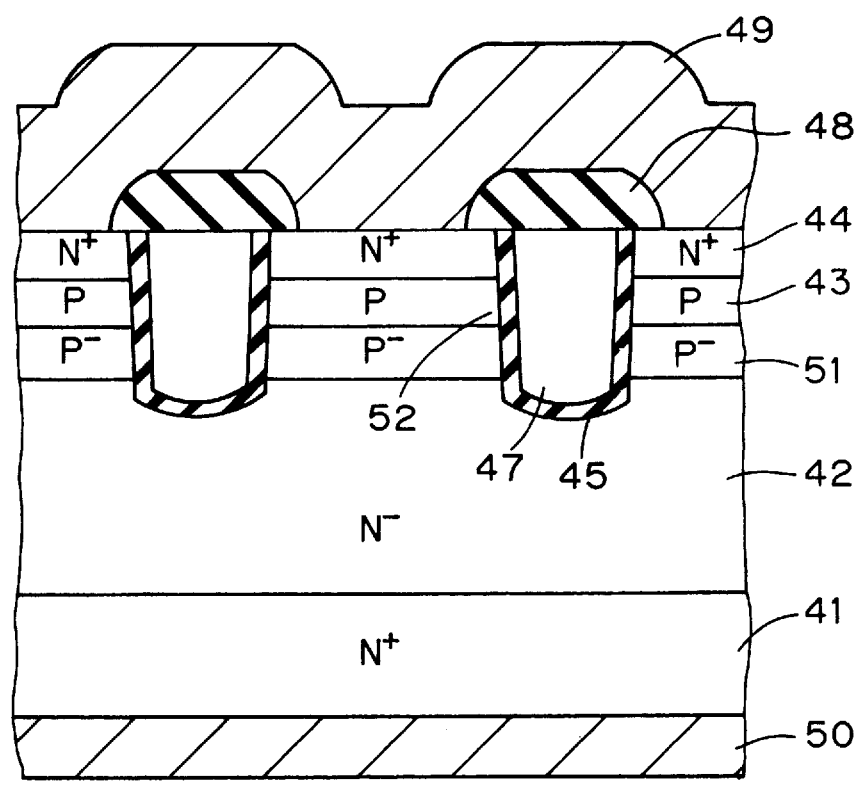
FIG. 19 is a fragmentary cross-sectional view of the insulated gate semiconductor device taken along the section of B—B of FIG. 17.

FIG. 17 is a fragmentary plan view of a UMOS in accordance with the third preferred embodiment of the present invention. FIG. 18 is a fragmentary cross-sectional view taken along the section of A—A shown in FIG. 17, while FIG. 19 is a fragmentary cross-sectional view taken along the section of B—B shown in FIG. 17. In FIG. 17, the source electrode 49 and the interlayer insulating film 48 of FIGS. 18 and 19 are omitted.

In the first and second preferred embodiments, the N⁺ source region 44 is so disposed as to be adjacent to the trench 47 and extend along the trench 47 in the direction of its length. In the third preferred embodiment, the N⁺ source region 44 intersects the trench 47 and is arranged alternately with the exposed face of the P base layer 43.

As shown in FIGS. 18 and 19, the P⁻ layer 51 is disposed between the P base layer 43 and the N⁻ layer 42. The N⁺ source region 44 is disposed on the surface region of the P base layer 43 and the exposed P base layers 43 are contiguous to each other with the P base layer 43 under the N⁺ source region 44.

This structure allows the trenches 45 to be densely arranged in a configuration of a plurality of cells, as well as a higher breakdown voltage like the first preferred embodiment.

In the case where the N⁺ source region 44 and the trench 45 are disposed in parallel with each other, since the polysilicon 47 in the trench 45 is covered with the interlayer insulating film 48 and there is a need to establish a connection of the source region 49 formed on the interlayer insulating film 48 with the N⁺ source region 44 and the P base layer 43, the two N⁺ regions 44 between the adjacent trenches 45 should be so disposed as to sandwich the P base layer 43.

The N⁺ source region 44, which is usually formed by diffusion, needs a width equivalent to the diffused layer depth. Moreover, an extra width, e.g., of about 0.5 to 1 $\mu$m in each side of the trench for mask alignment is required in forming the interlayer insulating film 48 to cover the polysilicon 47 in the trench 45 over the exposed surface of the N⁺ source regions 44 since there arises a need to establish a short circuit between the N⁺ source region 44 and the P base layer 43 in the later step. For these reasons, it is difficult to reduce the width of the N⁺ source region 44, and the N⁺ source region 44 of larger width imposes a restriction on reduction in the spacing L between the trenches, in consideration of the manufacturing process.

In the third preferred embodiment, however, since the N⁺ source region 44 intersects the trenches 47 and is disposed alternately with the P base layer 43, there is no need for an arrangement where the N⁺ source regions 44 between the adjacent trenches 47 should sandwich the exposed P base layer 43 and consequently the spacing L between the trenches can be sufficiently reduced. Therefore, the cells can be densely arranged to achieve a size reduction of the device.

The process of manufacturing the UMOS of the third preferred embodiment is the same as shown in association with the UMOS of the first preferred embodiment.

<The Fourth Preferred Embodiment>

Figure 20:
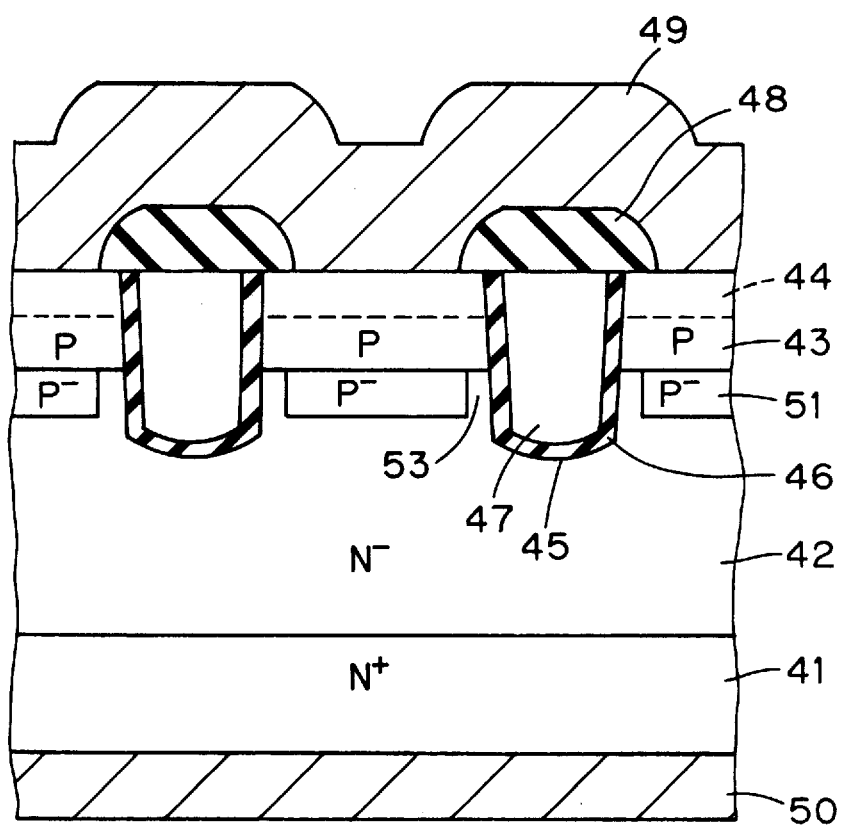
FIG. 20 is a fragmentary cross-sectional view of an insulated gate semiconductor device in accordance with a fourth preferred embodiment of the present invention.
Figure 21:
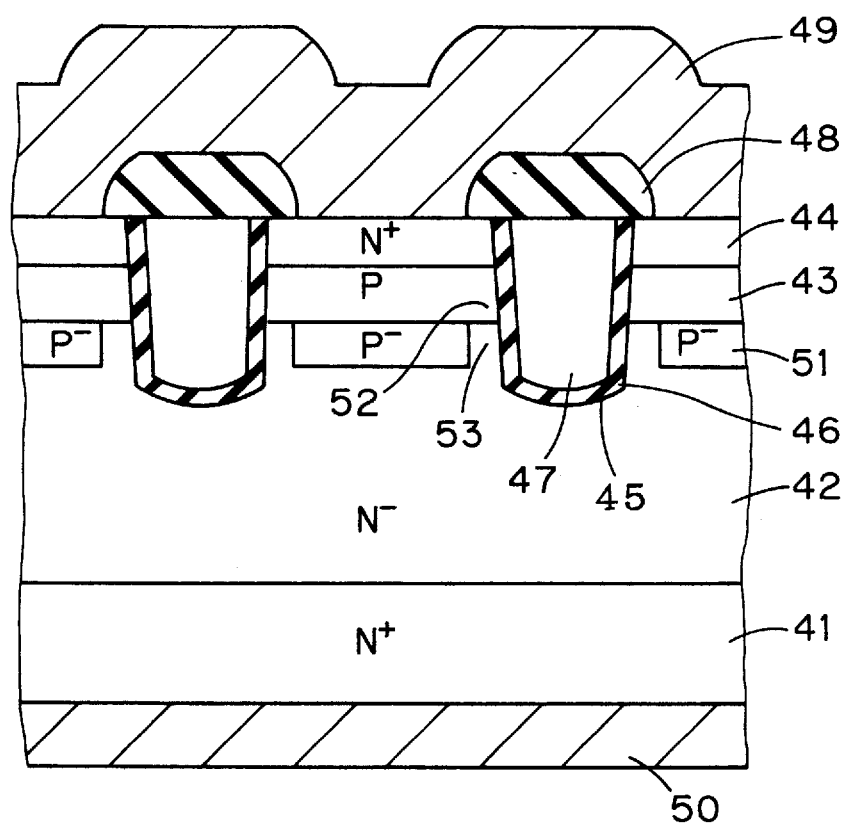
FIG. 21 is a fragmentary cross-sectional view of the insulated gate semiconductor device taken along another section of FIG. 20.

FIG. 20 is a fragmentary cross-sectional view of a UMOS in accordance with the fourth preferred embodiment of the present invention. FIG. 21 is a fragmentary cross-sectional view taken a section including the N⁺ source region 44.

A plan view of the same portion should be like FIG. 17 in association with the third preferred embodiment. FIG. 20 is a fragmentary cross-sectional view taken along the section of A—A shown in FIG. 17, while FIG. 21 is a fragmentary cross-sectional view taken along the section of B—B shown in FIG. 17.

The UMOS of the fourth preferred embodiment has an arrangement where the N⁺ source region 44 intersects the trench 47 and is disposed alternately with the exposed face of the P base layer 43, and moreover, the P⁻ layer 51 is opposed to the insulating film 46 of the trench 45 with the N⁻ layer 42 therebetween. Other structural features are the same as those of the third preferred embodiment.

This structure allows the cells to be densely arranged, keeping the ON-resistance low, as well as a higher breakdown voltage, to achieve a size reduction of the device.

The process of manufacturing the UMOS of the fourth preferred embodiment is the same as shown in association with the UMOS of the second preferred embodiment.

<The Fifth Preferred Embodiment>

Figure 22:
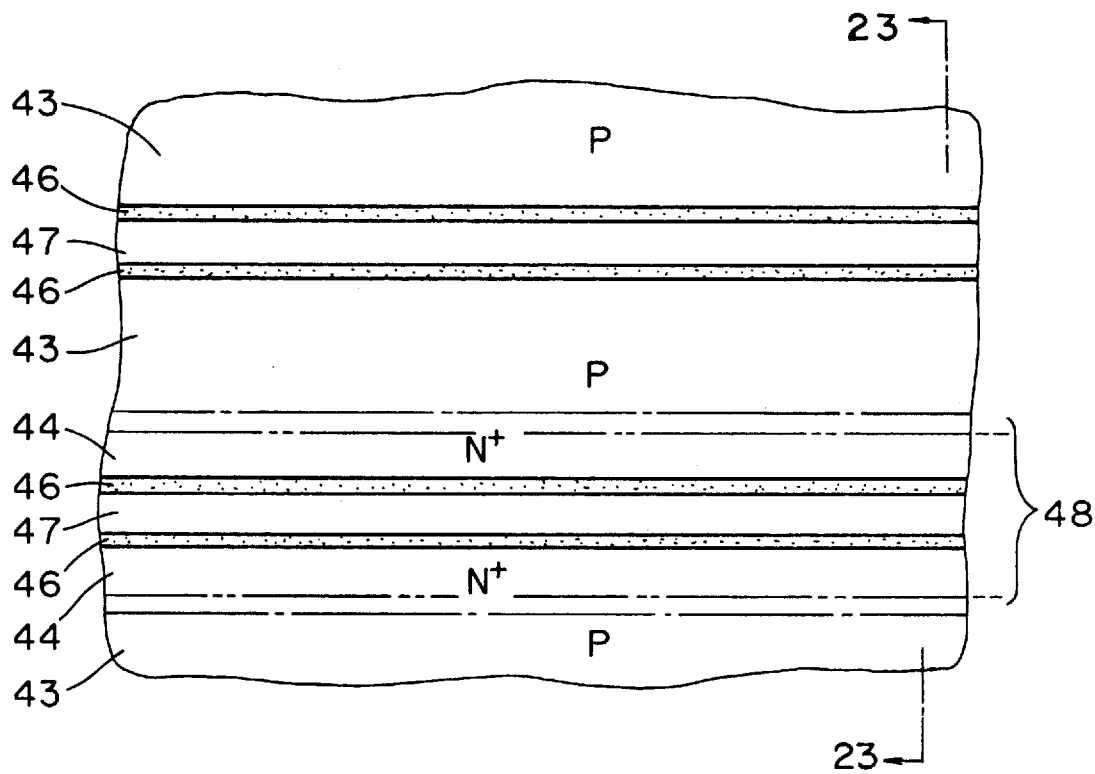
FIG. 22 is a fragmentary plan view of an insulated gate semiconductor device in accordance with a fifth preferred embodiment of the present invention.
Figure 23:
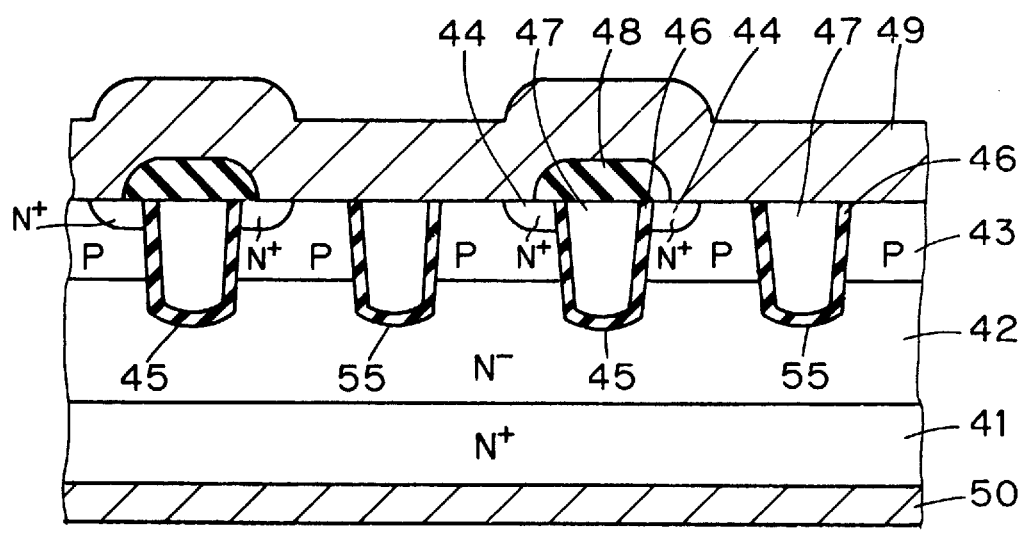
FIG. 23 is a fragmentary cross-sectional view of the insulated gate semiconductor device taken along the section of A—A of FIG. 22.

FIG. 22 is a fragmentary plan view of a UMOS in accordance with the fifth preferred embodiment of the present invention. A plan view of the whole device should be like FIG. 1, and the fragmentary plan view of FIG. 22 shows, for example, a portion which corresponds to the fragment 34. FIG. 23 is a fragmentary cross-sectional view taken along the section of A—A of FIG. 22. In FIG. 22, the source electrode 49 and the interlayer insulating film 48 of FIG. 23 are omitted.

In FIG. 23, the N⁻ layer 42 is formed over the surface of the N⁺ substrate 41, and the P base layer 43 is formed thereover. The N⁺ source regions 44 of stripe shape are formed in parallel, being spaced, in the surface of the P base layer 43. The trench 45 as a first trench is disposed along the stripe-shaped N⁺ source region 44 in the direction of its length, extending in a vertical direction from the surface of the N⁺ source region 44 to the N⁻ layer 42, and a trench 55 as a second trench is disposed, extending in a vertical direction from the surface of the P base layer 43 exposed between the adjacent N⁺ source regions 44 to the N⁻ layer 42. The insulating films 46 are formed over the respective inside walls of the trenches 45 and 55, and the insulating film 46 formed inside the trench 45 serves as a gate insulating film. The trenches 45 and 55 are filled with polisilicons 47 up to the opening portions of the respective surfaces.

The surface of the trench 45 is covered with the interlayer insulating film 48 and a source electrode 49 is disposed over the surface of the device where the interlayer insulating film 48, the surface of the polysilicon 47 in the trench 55, the N⁺ source region 44 and the P base layer 43 are found. The polysilicon 47 in the trench 55, the P base layer 43 and the N⁺ source region 44 are electrically connected by means of the source electrode 49. The drain electrode 50 is disposed over the other surface of the N⁺ substrate 41. A trench structure of the trench 55 will be temporarily referred to as "dummy trench".

In a device with a breakdown voltage of 60 V class, for example, when the spacing between the trenches 45 and 55 is about 1.5 $\mu$m and a trench width is 1 $\mu$m, a cell pitch is about 5 $\mu$m where the cell pitch defines a pitch between two normal trenches when a dummy trench is disposed between the normal trenches.

Other structural features are the same as those of the first preferred embodiment. And all of the elements are composed of the same materials as discussed in the first preferred embodiment. Furthermore, the dummy trench is insulated from the gate.

Now, an operation will be discussed.

Figure 24:
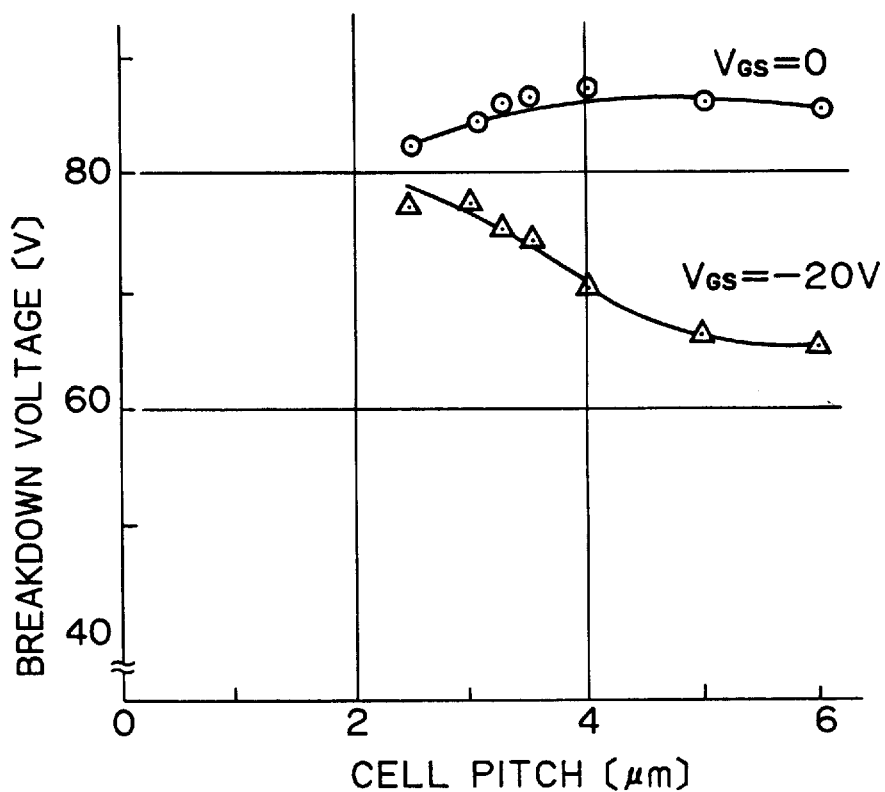
FIG. 24 is a graph showing a relation between a cell pitch and a breakdown voltage of the insulated gate semiconductor device of the present invention.

FIG. 24 is a graph showing a relation between the cell pitch and the breakdown voltage in the UMOS, which is given by simulation.

Figure 50:
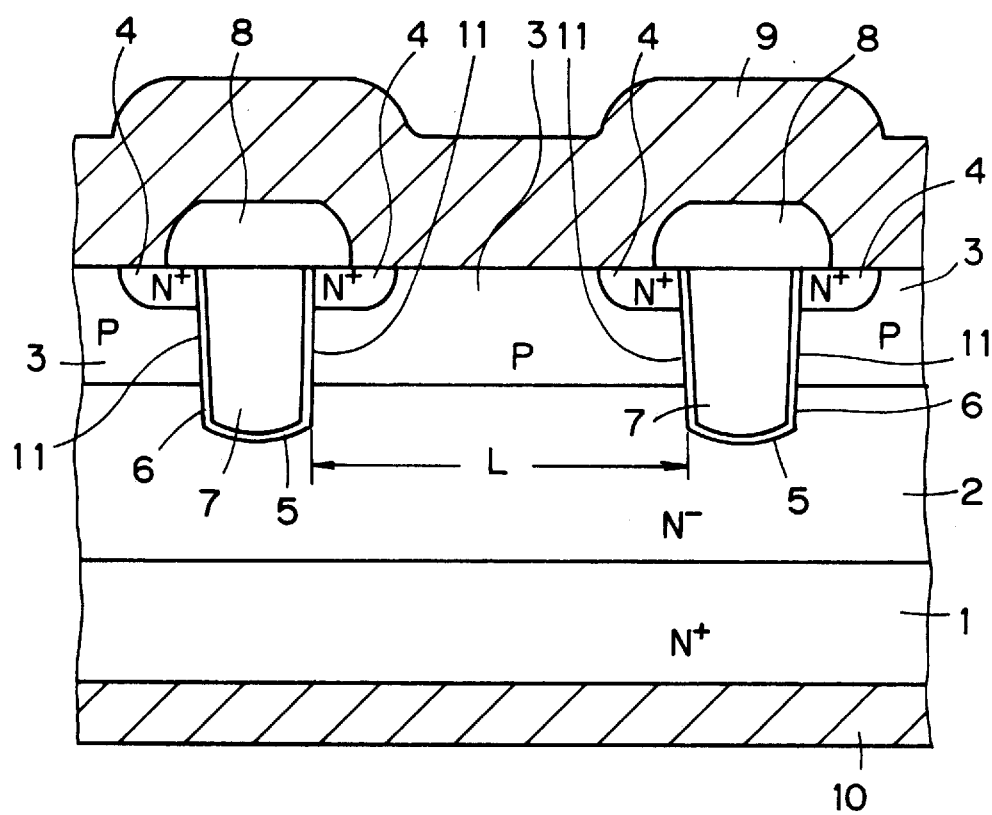
FIG. 50 is a cross-sectional view of an insulated gate semiconductor device in the background art.

This simulation, using cells of the same configuration as shown in FIG. 50, shows a change of the breakdown voltage as the cell pitch changes. Since the trench width is constant, the change of the cell pitch corresponds to the change of the spacing between the trenches.

FIG. 24 shows a change of the breakdown voltage of the device under the application of the drain voltage. When the gate voltage $V_{GS}$ is 0 V, the breakdown voltage little changes little and slightly falls as the cell pitch becomes 5 $\mu$m or narrower. In contrast, when the gate voltage $V_{GS}$ is reversely biased, the breakdown voltage rises as the cell pitch becomes narrower, getting close to the breakdown voltage when the gate voltage $V_{GS}$ is 0 V. Thus, it can be seen that the breakdown voltage when reversely biased rises as the cell pitch becomes narrower.

Accordingly, the breakdown voltage can increase if the spacing between the trenches is set sufficiently narrow even in the background-art device. If the spacing between the trenches is wide, an electric field is generated by a voltage equivalent to the sum of the drain voltage $V_{DS}$ and the reversely-biased gate voltage $V_{GS}$ at the tip end portion of the trench 5 which protrudes in the N⁻ layer 2. When the cell pitch is 5 μm or below, it seems that since an electric field is also generated by the same voltage at the tip end portion of the adjacent trench 5, an interference of the electric fields occurs between the adjacent trenches, mutually drawing the others' potential distributions at the tip end portions, to relieve an electric field concentration at the tip end portion of the trench 45, and as a result the breakdown voltage increases.

In the background-art structure, however, it is difficult to lessen the width of the N⁺ source region 44, in consideration of the manufacturing process, because the N⁺ source region, which is usually formed by diffusion, needs a width equivalent to the diffused layer depth in the case where the N⁺ source region is provided for every one trench 5, and an extra width for mask alignment is required in forming the interlayer insulating film to cover the polysilicon in the trench over the exposed surface of the N⁺ source regions since there arises a need for establishing a short circuit between the N⁺ source region and the P base layer.

In the fifth preferred embodiment, the dummy trench without the N⁺ source region is provided between the normal trenches 45, and the spacing between the dummy trench and the normal trench 45 is shortened by reduction in extra width for mask alignment, to thereby increase the breakdown voltage.

In the device provided with the dummy trenches, when the pitch between the normal trench and the dummy trench is 5 μm or below, since the electric field at the tip end portion of the trench 45 is equivalent to the applied voltage and the electric field at the tip end portion of the adjacent trench 55 (dummy trench) is equivalent to the source voltage, the interference of the potential distributions occurs between the normal trench and the dummy trench, mutually drawing the others' potential distributions at the tip end portions, to relieve the electric field concentration at the tip end portion of the trench 45. As the result, the breakdown voltage increases.

Next, a method of manufacturing the UMOS in the fifth preferred embodiment will be discussed.

FIGS. 25 to 33 are fragmentary cross-sectional views each showing a device in each step of a process of manufacturing the insulated gate semiconductor device of the present invention.

Figure 25:
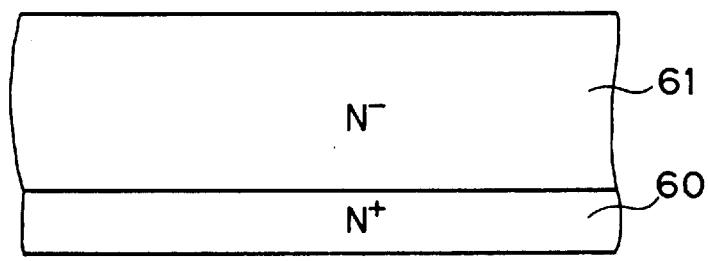
FIGS. 25 to 33 are fragmentary cross-sectional views each showing a device in each step of a process of manufacturing the insulated gate semiconductor device of the present invention.

First, the N⁺ substrate 60 is prepared and the N⁻ layer 61 is formed thereon (see FIG. 25).

Figure 26:
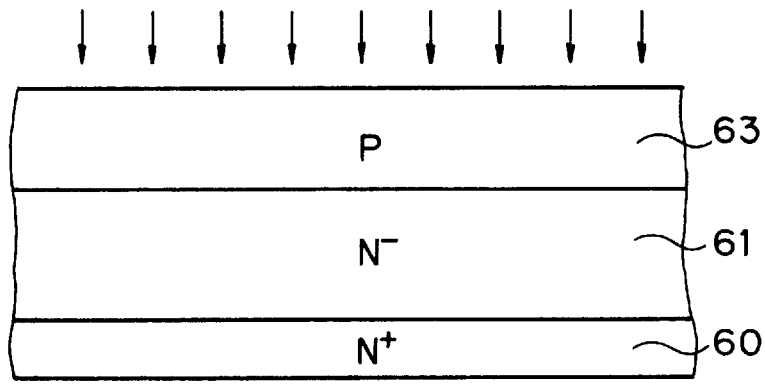
Figure 27:
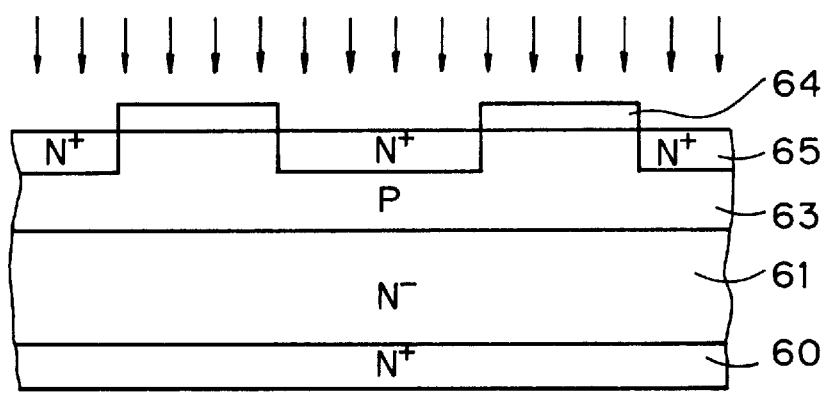
Figure 28:
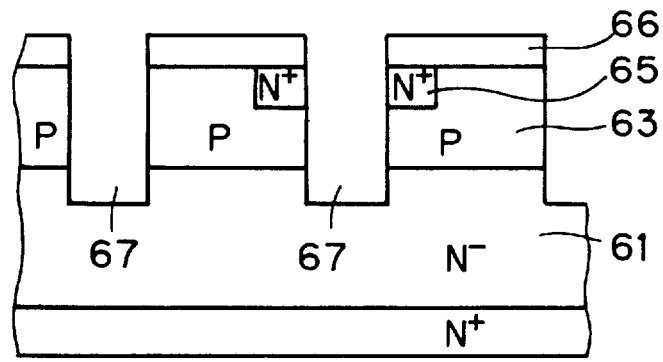

Next, the P-type impurity is implanted into the N⁻ layer 61 and diffused therein to form the P base layer 63 (see FIG. 26).

A resist is layered over the surface of the P base layer 63 and then a photolithographic process is performed to form the resist pattern 64 having a plurality of stripe-shaped openings as first openings. The N-type impurity is implanted in high concentration to the surface of the P base layer 63 through the resist patten 64 as a mask and diffused therein to form the N⁺ source regions 65 (see FIG. 27).

After that, the oxide film 66 is formed over the surfaces of the P base layer 63 and the N⁺ source region 65. A silicon etching mask is formed of the oxide film 66, having a stripe-shaped opening on the surface of the P base layer 63 as a second opening and a stripe-shaped opening on the surface of the N⁺ source region 65 as a third opening which is narrower in width than the N⁺ source region 65. An etching is performed through RIE (Reactive Ion Etching) by using the silicon etching mask of the oxide film 66 to form the trenches 67 which extend from the surface of the P base layer 63 and the surface of the N⁺ region 65 to the N⁻ layer 61 (see FIG. 28).

Next, a thermal oxide film is formed over the surface of the trenches 67. The polysilicon 69 doped with the P-type impurity is layered on the oxide film over the surfaces of the P base layer 63, the N⁺ source region 65 and the trenches 67, to fill the trenches 67 (see FIG. 29).

Figure 30:
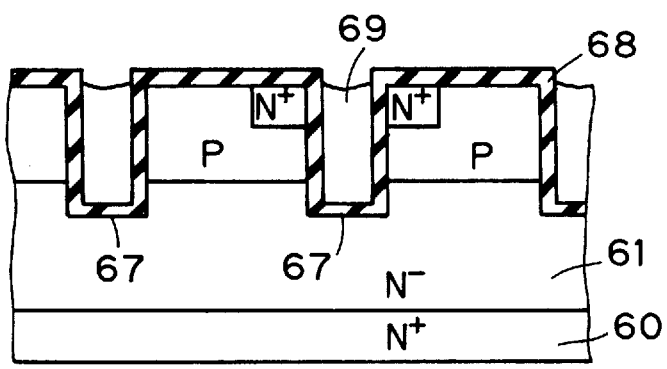

The layered polysilicon 69 is etched back to the opening portion of the trench 67, so as to leave the polysilicon 69 filling the trench 67 (see FIG. 30).

Figure 31:
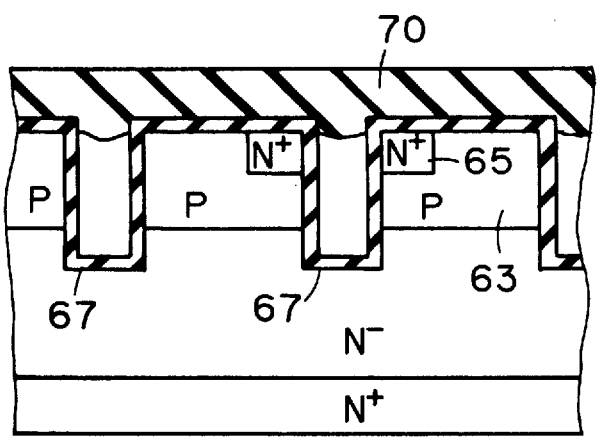
Figure 32:
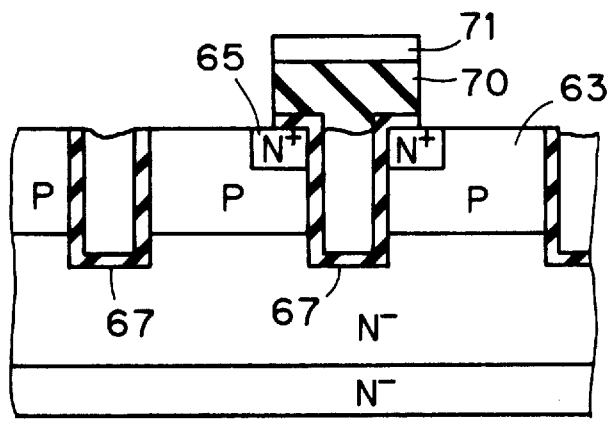
Figure 33:
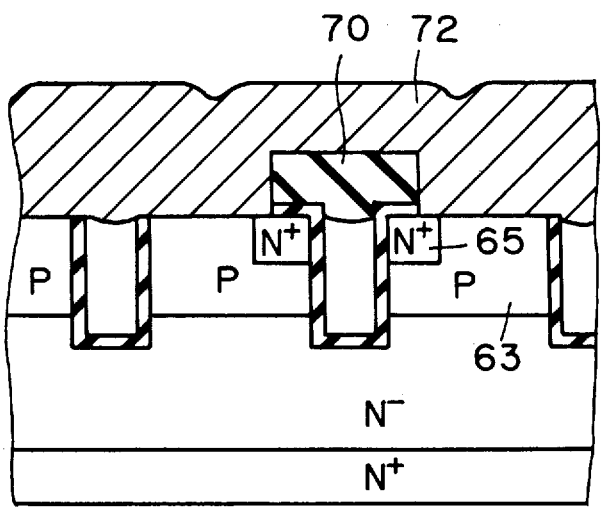

After that, the BPSG 70 is layered over the surfaces of the P base layer 63 and the N⁺ source region 65 and the surface of the polysilicon 69 buried in the trench 67 (see FIG. 31).

Next, the resist 71 is layered over the BPSG 70 and then a photolithographic process is performed to form a resist pattern having an opening to encircle the surface of the P base layer 63, the opening portion of the trench 67 formed in the surface of the P base layer 63 and some portions of the N⁺ source region 65, to close the remaining portions of the N⁺ source region 65 and the opening portion of the trench 67 formed in the N⁺ source region 65. An etching of the BPSG 70 and the oxide film 68 is performed by using the resist pattern as a mask, to form the interlayer insulating film 70 over the surface of the polysilicon 69 buried in the trench 67 (see FIG. 32).

The Al—Si 72 is layered over the surfaces of the P base layer 63 and the portions of the N⁺ source region 65 which are exposed by etching and the interlayer insulating film 70 so that the P base layer 63 and the N⁺ source region 65 may be short circuited. At the same time, the source electrode, the gate interconnection connected to the polysilicon 69 buried in the trench 67 and the gate pad are formed (see FIG. 33).

Further, the drain electrode is formed over the other surface of the N⁺ substrate 60.

<The Sixth Preferred Embodiment>

Figure 34:
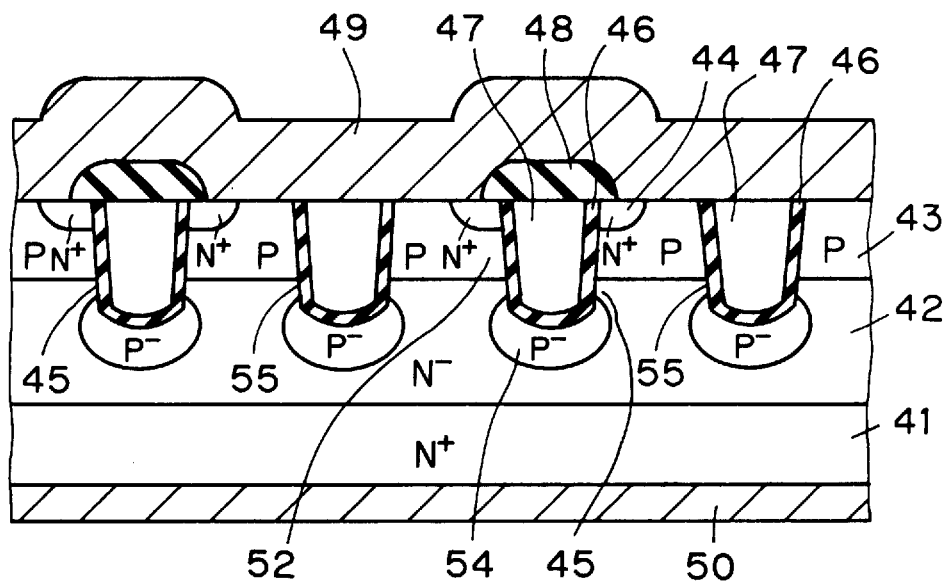
FIG. 34 is a fragmentary plan view of an insulated gate semiconductor device in accordance with a sixth preferred embodiment of the present invention.

FIG. 34 is a fragmentary plan view of a UMOS in accordance with the sixth preferred embodiment of the present invention.

The UMOS of the sixth preferred embodiment has an arrangement where a P⁻ region 54 as a third semiconductor layer is formed in the N⁻ layer 42, facing the bottom portions of the trench 45 and the trench 55 of the fifth preferred embodiment. Other structural features are the same as those of the fifth preferred embodiment.

By providing the P⁻ region 54 as above, the potential distributions of the tip end portions of the trenches 45 and 55 extend along the P⁻ region 54 and an interference of the electric fields easily occurs between the adjacent trenches. As the result, the electric fields at the tip end portions of the respective trenches are relieved to achieve a higher breakdown voltage of the device.

A method of manufacturing the UMOS of the sixth preferred embodiment will be discussed.

Figure 35:
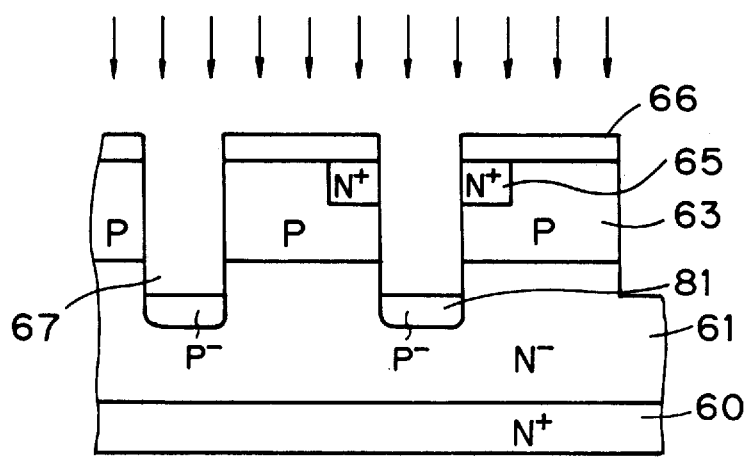
FIG. 35 is a fragmentary cross-sectional view of a device in a process of manufacturing the insulated gate semiconductor device of the present invention.

FIG. 35 is a fragmentary cross-sectional view of a device in the manufacturing process.

The method of manufacturing the UMOS of the sixth preferred embodiment is almost the same as that of the fifth preferred embodiment. Specifically, the manufacturing process goes in a like manner until the step of forming the trench 67 (see FIG. 28), and subsequently the P-type impurity is implanted in low concentration by using the silicon etching mask 66 as a mask and diffused to form a P⁻ region 81 in the N⁻ layer 61, facing the bottom portion of the trench 67 (see FIG. 35).

Figure 29:
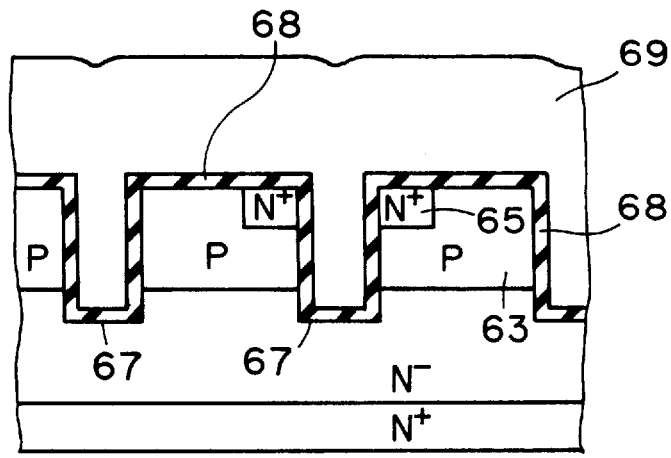

A thermal oxide film is subsequently formed over the surface of the trench 67, and the polysilicon doped with the P-type impurity is layered on the oxide film 68 over the surfaces of the P base layer 63, N$^+$ source region 65 and the trench 67, to fill the trench 67 (see FIG. 29).

The steps following the above process are the same as those of the fifth preferred embodiment.

<The Seventh Preferred Embodiment>

Figure 36:
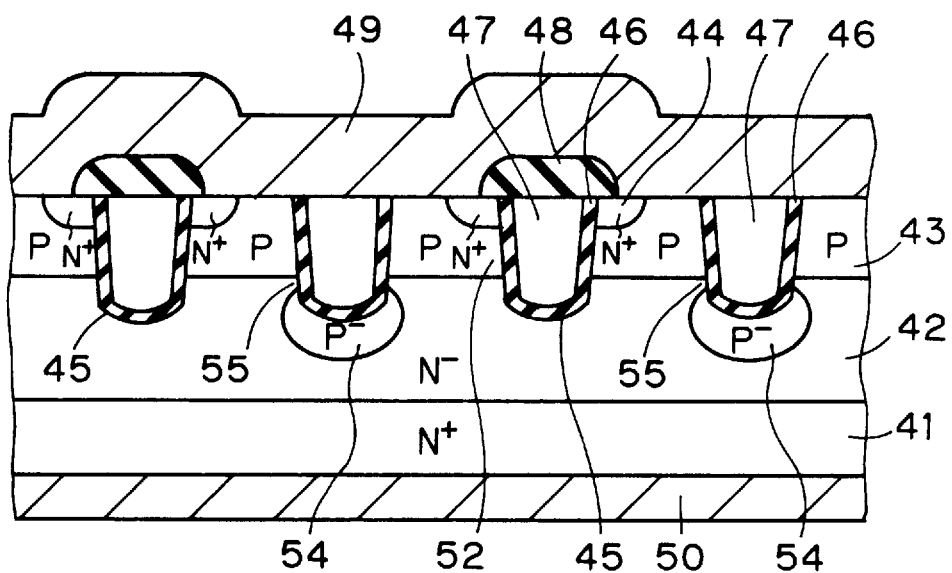
FIG. 36 is a fragmentary plan view of an insulated gate semiconductor device in accordance with a seventh preferred embodiment of the present invention.

FIG. 36 is a fragmentary plan view of a UMOS in accordance with the seventh preferred embodiment of the present invention.

The UMOS of the seventh preferred embodiment has an arrangement where the P$^-$ region 54 is formed in the N$^-$ layer 42, facing the bottom portion of the trench 55 of the fifth preferred embodiment. Other structural features are the same as those of the fifth preferred embodiment.

By providing the P$^-$ region 54 as above, the potential distribution of the tip end portion of the trench 55 extends along the P$^-$ region 54 and an interference of the electric fields easily occurs between the adjacent trenches. As the result, the electric field at the tip end portion of each of the trenches is relieved to achieve a higher breakdown voltage.

Since the P$^-$ region 54 is not formed on the current path from the source electrode 49 to the drain electrode 50 via the channel region 52 formed in the vicinity of the trench 45, it is possible to suppress the ON-resistance.

A method of manufacturing the UMOS of the seventh preferred embodiment will be discussed.

FIGS. 37 to 48 are fragmentary cross-sectional views each showing a device in each step of a process of manufacturing the insulated gate semiconductor device of the present invention.

Figure 37:
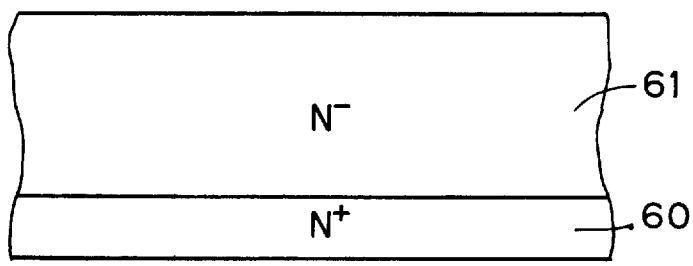

First, the N$^+$ substrate 60 is prepared and the N$^-$ layer 61 is formed thereon (see FIG. 37).

Figure 38:
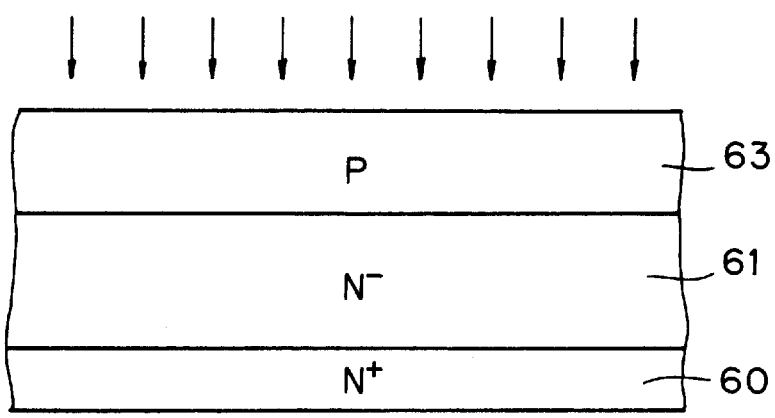
Figure 39:
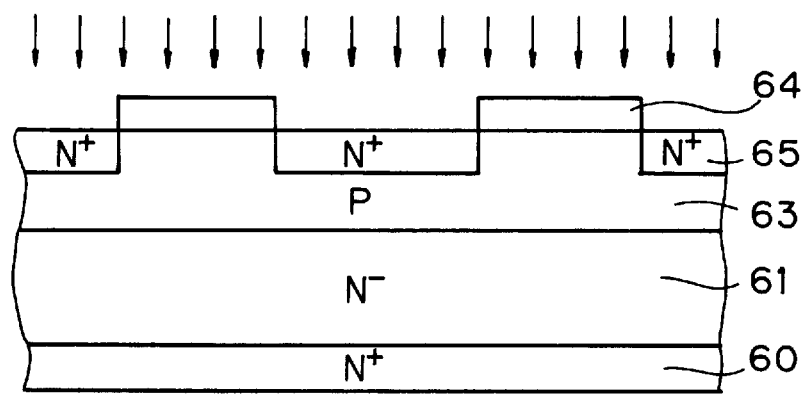

Next, the P-type impurity is implanted into the N$^-$ layer 61 and diffused therein to form the P base layer 63 (see FIG. 38).

A resist is layered over the surface of the P base layer 63 and then a photolithographic process is performed to form the resist pattern 64 having a plurality of stripe-shaped openings as first openings. The N-type impurity is implanted in high concentration into the surface of the P base layer 63 through the resist patten 64 as a mask and diffused therein to form the N$^+$ source regions 65 (see FIG. 39).

After that, the oxide film 66 is formed as a shield film over the surfaces of the P base layer 63 and the N$^+$ source regions 65. A silicon etching mask is formed of the oxide film 66, having a stripe-shaped opening on the surface of the P base layer 63 as a second opening. An etching is performed through RIE by using the silicon etching mask to form the trench 67 which extends from the surface of the N$^+$ region 65 to the N$^-$ layer 61. The P-type impurity is implanted in low concentration by using the silicon etching mask as a mask and is diffused to form the P$^-$ region 81 in the N$^-$ layer 61, facing the bottom portion of the trench 67 (see FIG. 40).

A thermal oxide film is subsequently formed over the surface of the trench 67, and the polysilicon 69 doped with the P-type impurity is layered over the surface of the device, to fill the trench 67 (see FIG. 41).

Figure 42:
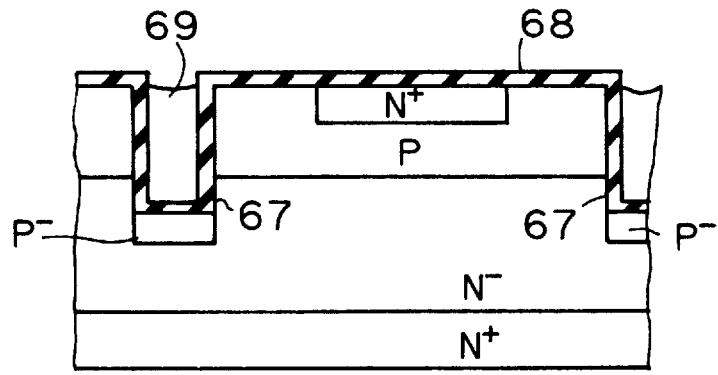

The layered polysilicon 69 is etched back to the opening portion of the trench 67 so as to leave the polysilicon 69 filling the trench 67 (see FIG. 42).

An oxide film is formed over the surface of the polysilicon 69 filling the trench 67 up to its opening portion. A silicon etching mask 84 is formed of the oxide film over the surface of the device, having a stripe-shaped opening as a third opening on the surface of the N$^+$ source region 65 along the trench 67 formed on the surface of the P base layer 63. An etching is performed through RIE by using the silicon etching mask 84 as a mask to form a trench 82 which extends from the surface of the N$^+$ region 65 to the N$^-$ layer 61 (see FIG. 43).

A thermal oxide film is subsequently formed over the surface of the trench 82, and a polysilicon 83 doped with the P-type impurity is layered over the surface of the device, to fill the trench 82 (see FIG. 44).

Figure 45:
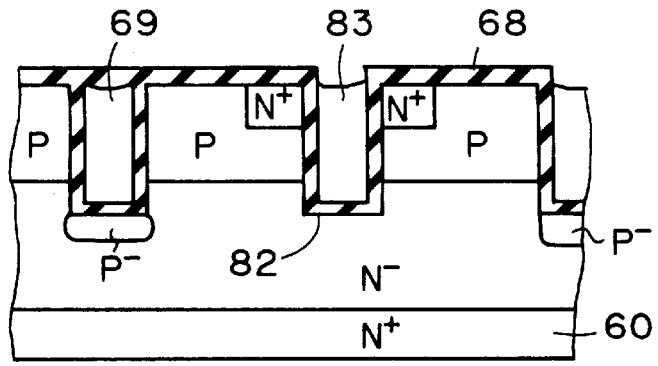

The layered polysilicon 83 is etched back to the opening portion of the trench 82 so as to leave the polysilicon 69 filling the trench 82 (see FIG. 45).

Figure 43:
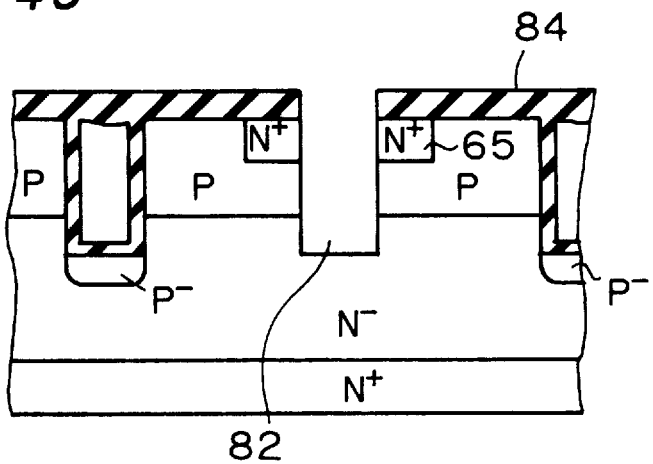
Figure 44:
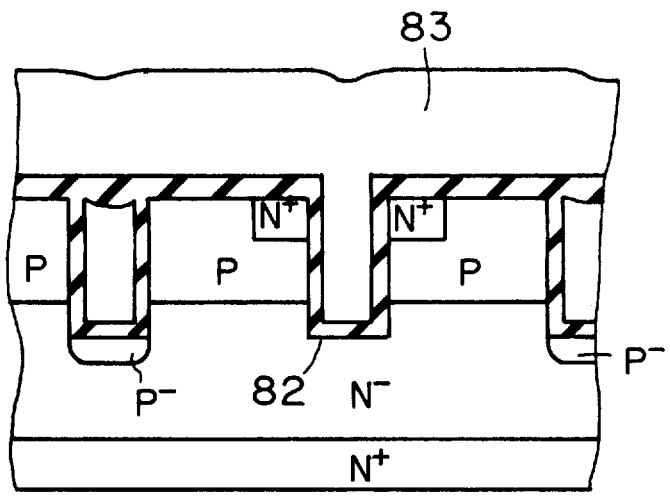

The steps shown in FIGS. 40 to 42 may be performed after the steps shown in FIGS. 43 to 45.

Figure 46:
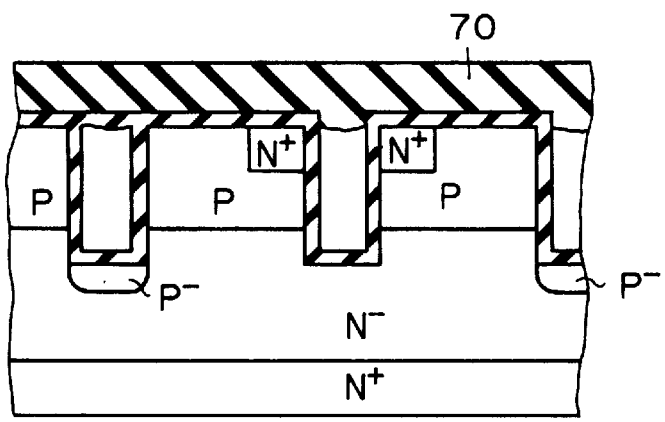
Figure 47:
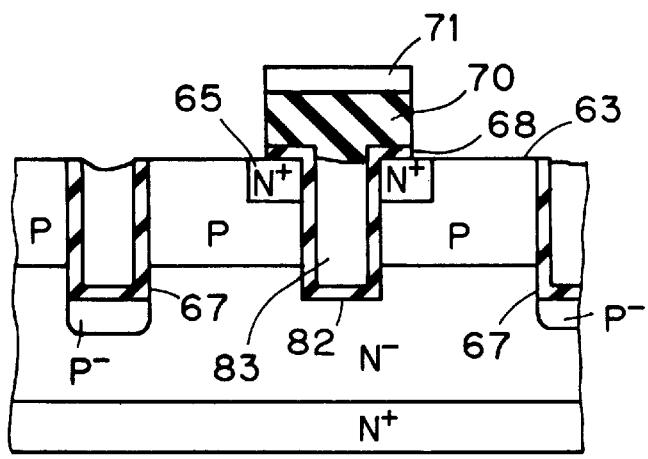
Figure 48:
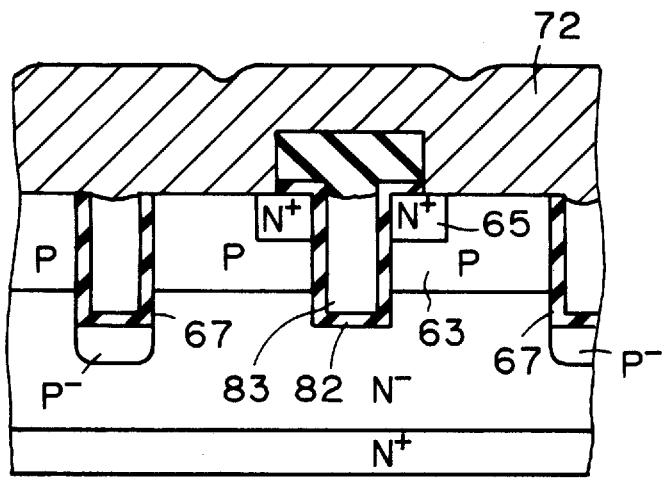

In the subsequent step, the BPSG 70 is layered over the device (see FIG. 46).

Next, a resist is layered over the BPSG 70 and then a photolithographic process is performed to form the resist pattern 71 having an opening to encircle the surface of the P base layer 63, the opening portion of the trench 67 formed in the surface of the P base layer 63 and some portions of the N$^+$ source region 65, to close the remaining portions of the N$^+$ source region 65 and the opening portion of the trench 82 formed in the N$^+$ source region 65. An etching of the BPSG 70 and the oxide film 68 is performed by using the resist pattern 71 as a mask, to form an interlayer insulating film over the surface of the polysilicon 83 buried in the trench 82 (see FIG. 47).

The Al—Si 72 is layered over the surfaces of the P base layer 63 and the portions of the N$^+$ source region 65 which are exposed by etching and the interlayer insulating film so that the P base layer 63 and the N$^+$ source region 65 may be short circuited. At the same time, the source electrode, the gate interconnection connected to the polysilicon 83 buried in the trench 82 and the gate pad are formed (see FIG. 48).

Further, the drain electrode is formed over the other surface of the N$^+$ substrate 60.

<The Eighth Preferred Embodiment>

Figure 49:
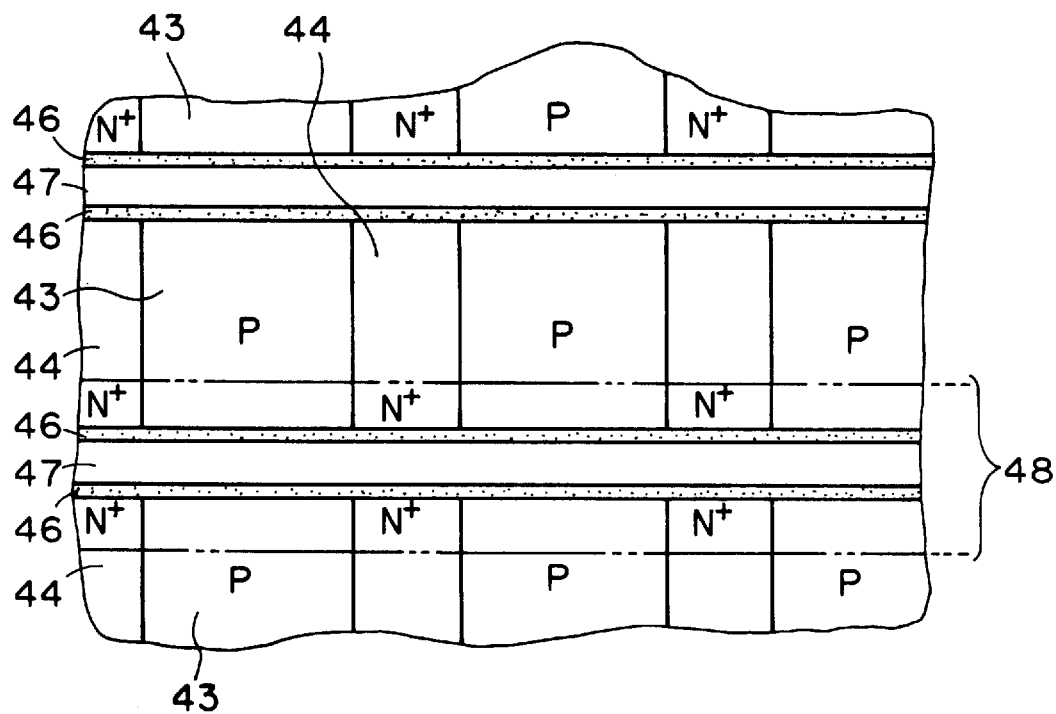
FIG. 49 is a fragmentary plan view of an insulated gate semiconductor device in accordance with an eighth preferred embodiment of the present invention.

FIG. 49 is a fragmentary plan view of a UMOS in accordance with the eighth preferred embodiment of the present invention.

The UMOS of the eighth preferred embodiment has an arrangement where a plurality of the stripe-shaped N$^+$ source regions 44 are aligned in a row on the surface of the P base layer 43 and the trench 47 is so disposed as to intersect the N$^+$ source regions 44. The P base layer 43 existing under the N$^+$ source regions 44 is contiguous to the exposed P base layer 43 between the N$^+$ source regions 44. Other structural features other than the arrangement of the N$^+$ source regions 44 are the same as those of the fifth to seventh preferred embodiments.

Having such a configuration as above, the UMOS can establish an electrical connection of the P base layer 43 and the N$^+$ source region 44 with the source electrode 49 unrestrictedly at the exposed portion of the N$^+$ source regions 44 intersecting the trench 47, not covered with the interlayer insulating film 48. Accordingly, the extra width required for the mask alignment can be reduced in forming the interlayer insulating film 48. As the result, it becomes possible to set a shorter spacing between the trench serving as a gate and the dummy trench and obtain a cell configuration of higher density, as compared with the case where the N$^+$ source regions 44 extend adjacently to the trench 47 along the direction of its length. Therefore, a device of smaller size can be achieved.

Although an N-channel UMOS has been discussed above, the present invention may be naturally applied to an P-channel UMOS.

While the invention has been shown and described in detail, the foregoing description is in all aspects illustrative and not restrictive. It is therefore understood that numerous modifications and variations can be devised without departing from the scope of the invention.

I claim:

1. An insulated gate semiconductor device, comprising:
   a semiconductor substrate of a first conductivity type, having a first major surface and a second major surface;
   a first semiconductor layer of a second conductivity type disposed on said first major surface of said semiconductor substrate, having a first surface and at least one trench with an opening at said surface reaching said first major surface of said semiconductor substrate in a direction vertical to said surface of said first semiconductor layer;
   an insulating film formed over an inside wall of said at least one trench;
   a conductor disposed inside said at least one trench, being opposed to said first semiconductor layer with said insulating film therebetween;
   a second semiconductor layer of the first conductivity type disposed in a portion of said surface of said first semiconductor layer, being opposed to said conductor with said insulating film therebetween;
   an insulating layer so disposed as to cover a portion of a surface of said second semiconductor layer and a surface of said conductor;
   a third semiconductor layer of the second conductivity type disposed between said first major surface of said semiconductor substrate and said first semiconductor layer and formed along a second surface of said first semiconductor layer, the impurity concentration of said third semiconductor layer being lower than that of said first semiconductor layer;
   a first main electrode disposed on said surfaces of said first and second semiconductor layers; and
   a second main electrode disposed on said second major surface of said semiconductor substrate; wherein said at least one trench includes first and second trenches and said third semiconductor layer is located between said first and second trenches, and wherein said conductor is insulated from the first, second and third semiconductor layers.

2. The insulated gate semiconductor device of claim 1, wherein said at least one trench includes at least said first and second trenches as a plurality of trenches,
   said second semiconductor layer includes a plurality of fourth semiconductor layers adjoining said plurality of trenches along said both sides of said opening, and
   two of said fourth semiconductor layers existing between adjacent ones of said plurality of trenches are arranged so that said first semiconductor layer may be laid between said two fourth semiconductor layers.

3. The insulated gate semiconductor device of claim 1, wherein said at least one trench includes at least said first and second trenches as a plurality of trenches, and
   said second semiconductor layers include a plurality of fourth semiconductor layers which extend in parallel with each other, intersecting openings of said plurality of trenches.

4. An insulated gate semiconductor, comprising:
   a semiconductor substrate of a first conductivity type, having a first major surface and a second major surface;
   a first semiconductor layer of a second conductivity type disposed on said first major surface of said semiconductor substrate, having a surface and at least one trench with an opening at said surface reaching said first major surface of said semiconductor substrate in a direction vertical to said surface of said first semiconductor layer;
   an insulating film formed over an inside wall of said at least one trench;
   a conductor disposed inside said at least one trench, being opposed to said first semiconductor layer with said insulating film therebetween;
   a second semiconductor layer of the first conductivity type disposed in a portion of said surface of said first semiconductor layer, being opposed to said conductor with said insulating film therebetween;
   an insulating layer so disposed as to cover a portion of a surface of said second semiconductor layer and a surface of said conductor;
   a third semiconductor layer of the second conductivity type disposed between said first major surface of said semiconductor substrate and said first semiconductor layer, the impurity concentration of which is lower than that of said first semiconductor layer;
   a first main electrode disposed on said surfaces of said first and second semiconductor layers; and
   a second main electrode disposed on said second major surface of said semiconductor substrate;
   wherein said third semiconductor layer is opposed to said at least one trench with a portion of said semiconductor substrate therebetween.

5. The insulated gate semiconductor device of claim 4, wherein
   said at least one trench includes a plurality of trenches,
   said second semiconductor layer includes a plurality of fourth semiconductor layers adjoining said plurality of trenches, and
   two of said fourth semiconductor layers existing between adjacent ones of said plurality of trenches are arranged so that said first semiconductor layer may be laid between said two fourth semiconductor layers.

6. The insulated gate semiconductor device of claim 4, wherein
   said at least one trench includes a plurality of trenches, and
   said second semiconductor layers include a plurality of fourth semiconductor layers which extend in parallel with each other, intersecting openings of said plurality of trenches.

7. An insulated gate semiconductor device, comprising:
   a semiconductor substrate of a first conductivity type, having a first major surface and a second major surface;
   a first semiconductor layer of a second conductivity type disposed on said first major surface of said semiconductor substrate, having a surface, at least one first trench and at least one second trench, said at least one first trench and said at least one second trench each having an opening at said surface, being parallel and reaching said first major surface of said semiconductor substrate;
   a first insulating film formed over an inside wall of said at least one first trench;

a second insulating film formed over an inside wall of said at least one second trench;

a first conductor disposed inside said at least one first trench, being opposed to said first semiconductor layer with said first insulating film therebetween;

a second conductor disposed inside said at least one second trench, being opposed to said first semiconductor layer with said second insulating film therebetween;

a second semiconductor layer of the first conductivity type disposed in a portion of said surface of said first semiconductor layer, being opposed to said first conductor with said first insulating film therebetween;

an insulating layer so disposed as to cover a surface of said first conductor and a portion of a surface of said second semiconductor layer;

a first main electrode short circuited to said second conductor and disposed on said surfaces of said first and second semiconductor layers;

a second main electrode disposed on said second major surface of said semiconductor substrate.

8. The insulated gate semiconductor device of claim 7, wherein said at least one first trench includes a plurality of third trenches, said at least one second trench includes a plurality of fourth trenches, said second semiconductor layer includes a plurality of third semiconductor layers, said third trenches and said fourth trenches are arranged to alternate with respect to each other, and said third semiconductor layers adjoin said third trenches.

9. The insulated gate semiconductor device of claim 7, wherein said at least one first trench includes a plurality of third trenches, said at least one second trench includes a plurality of fourth trenches, said second semiconductor layer includes a plurality of third semiconductor layers, said third trenches and said fourth trenches are arranged to alternate with respect to each other, and said third semiconductor layers are disposed in such stripe shapes as to intersect said third trenches and said fourth trenches.

10. The insulated gate semiconductor device of claim 7, wherein a plurality of third semiconductor layers of the second conductivity type, the impurity concentration of which is lower than that of said first semiconductor layer, are disposed in portions of said semiconductor substrate which are opposed to said first conductor at a bottom portion of said at least one first trench with said first insulating film therebetween and/or opposed to said second conductor at a bottom portion of said at least one second trench with said second insulating film therebetween.

11. The insulated gate semiconductor device claim 7, wherein said at least one first trench includes a plurality of third trenches, said at least one second trench includes a plurality of fourth trenches, said second semiconductor layer includes a plurality of fourth semiconductor layers, said third trenches and said fourth trenches are arranged to alternate with respect to each other, and said fourth semiconductor layers adjoin said third trenches.

12. The insulated gate semiconductor device of claim 7, wherein said at least one first trench includes a plurality of third trenches, said at least one second trench includes a plurality of fourth trenches, said second semiconductor layer includes a plurality of fourth semiconductor layers, said third trenches and said fourth trenches are alternately arranged, and said fourth semiconductor layers are disposed in such stripe shapes as to intersect said third trenches and said fourth trenches.

13. The insulated gate semiconductor device of claim 10, wherein said plurality of third semiconductor layers are disposed being opposed only to said second conductor in said at least one second trench with said second insulating film therebetween.

14. The insulated gate semiconductor device of claim 13, wherein said at least one first trench includes a plurality of third trenches, said at least one second trench includes a plurality of fourth trenches, said second semiconductor layer includes a plurality of fourth semiconductor layers, said third trenches and said fourth trenches are arranged to alternate with respect to each other, and said fourth semiconductor layers adjoin said third trenches.

15. The insulated gate semiconductor device of claim 13, wherein said at least one first trench includes a plurality of third trenches, said at least one second trench includes a plurality of fourth trenches, said second semiconductor layer includes a plurality of fourth semiconductor layers, said third trenches and said fourth trenches are arranged to alternate with respect to each other, and said fourth semiconductor layers are disposed in such stripe shapes as to intersect said third trenches and said fourth trenches.

16. The insulated gate semiconductor device of claim 1, wherein said third semiconductor layer contacts said first semiconductor layer.

* * * * *